United States Patent [19]

Mitani et al.

[11] Patent Number: 6,147,525
[45] Date of Patent: Nov. 14, 2000

[54] FREQUENCY MULTIPLIER CIRCUIT OPERABLE WITH AN EXTERNAL REFERENCE CLOCK SIGNAL HAVING A FREQUENCY IN A WIDE RANGE

[75] Inventors: Hiroshi Mitani, Yokohama; Nobutaka Kitagawa, Kawasaki, both of Japan; Kazuhito Fujii, San Francisco, Calif.

[73] Assignee: Kabushiki Kaisha Toshiba, Kawasaki, Japan

[21] Appl. No.: 09/199,821

[22] Filed: Nov. 25, 1998

[30] Foreign Application Priority Data

Nov. 26, 1997 [JP] Japan .................................. 9-324292

[51] Int. Cl.[7] .................................................. H03B 19/00
[52] U.S. Cl. .......................... 327/119; 327/116; 327/158
[58] Field of Search ........................... 327/116, 119–122, 327/156, 158, 356, 357, 359

[56] References Cited

U.S. PATENT DOCUMENTS

| 5,355,037 | 10/1994 | Andresen et al. ....................... 327/158 |
| 5,389,830 | 2/1995 | Buckingham et al. .................. 327/116 |
| 5,451,911 | 9/1995 | Colvin et al. ............................ 327/291 |
| 5,955,902 | 9/1999 | Takada et al. .......................... 327/116 |

FOREIGN PATENT DOCUMENTS 0 225 396   6/1987   European Pat. Off. .

OTHER PUBLICATIONS

A. Rothermel, et al., IEEE Journal of Solid–State Circuits, vol. 28, No. 7, pp. 853–856, "Analog Phase Measuring Circuit for Digital CMOS IC's", Jul., 1993.

A. Efendovich, et al., IEEE Journal of solid–state circuits, vol. 29, No. 1, pp. 67–70, "Multifrequency Zero–Jitter Delay–Locked Loop", Jan., 1994.

*Primary Examiner*—Kenneth B. Wells
*Attorney, Agent, or Firm*—Oblon, Spivak, McClelland, Maier & Neustadt, P.C.

[57] ABSTRACT

A frequency multiplier circuit needs to have a voltage controlled oscillator circuit having a wide oscillation frequency range, or delay cells each having a delay value which can be controlled over a wide range. Depending on the frequency multiplication factor, however, a frequency multiplied clock signal susceptible to influence of noise is generated. In the disclosed frequency multiplier circuit, there are provided a phase comparison input selection circuit for conducting a selection out of output signals of delay cells forming a voltage controlled delay circuit according to a frequency multiplication factor setting signal and an input frequency range setting signal and outputting the selected signal to a phase comparator, and a selected waveform generation circuit for generating a frequency multiplied clock signal CKOUT from the output signals of the delay cells according to the frequency multiplication factor setting signal and the input frequency range setting signal.

15 Claims, 18 Drawing Sheets

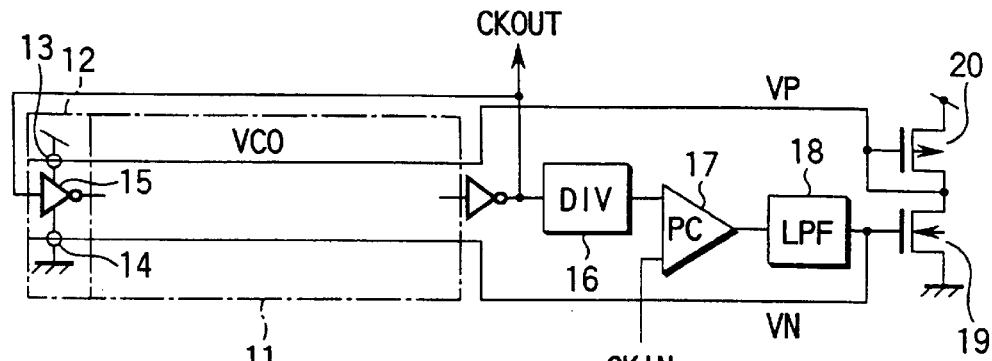
FIG. 9 *PRIOR ART*
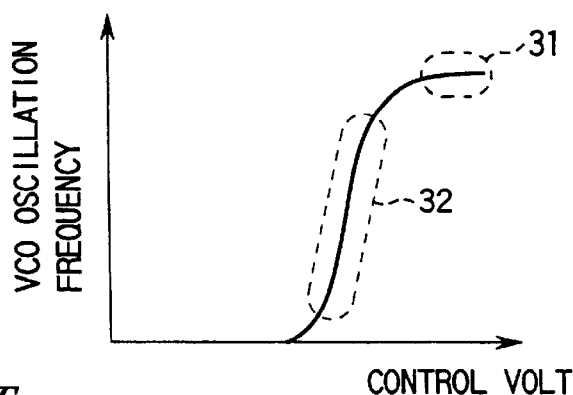
FIG. 10 *PRIOR ART*
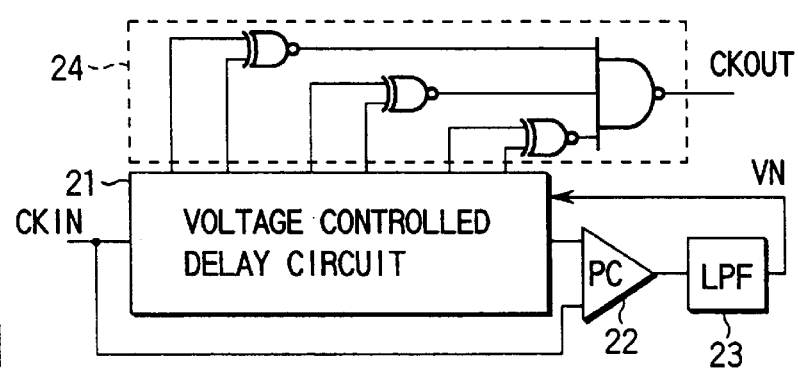
FIG. 11 *PRIOR ART*
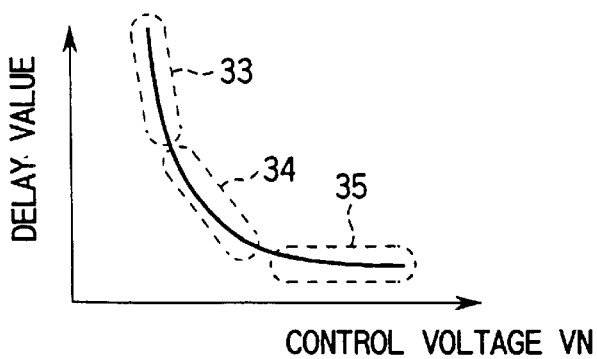
FIG. 12 *PRIOR ART*

| | S1 | S2 | S3 | S4 |
|---|---|---|---|---|
| WHEN 20 MHz IS OUTPUT | H | H | H | H |
| WHEN 10 MHz IS OUTPUT | H | L | H | L |
| WHEN 5 MHz IS OUTPUT | H | L | L | L |

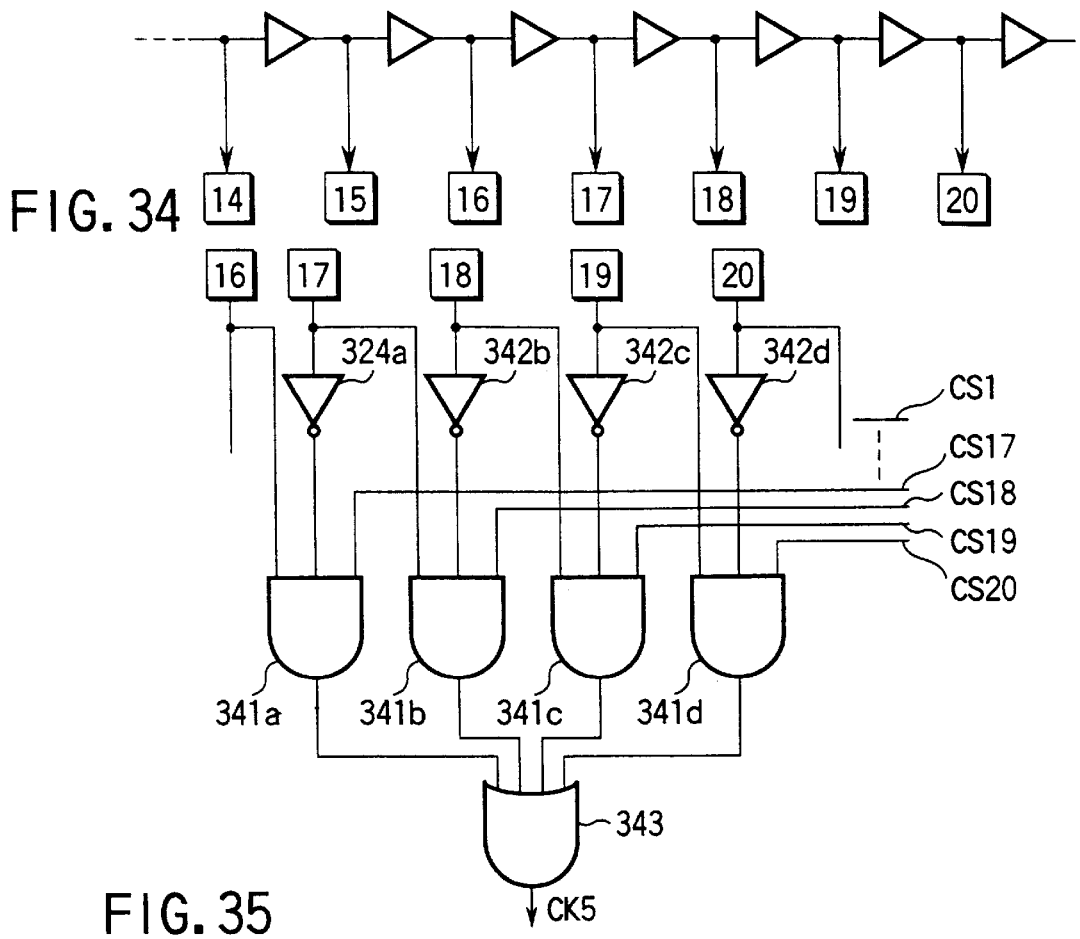
FIG. 34
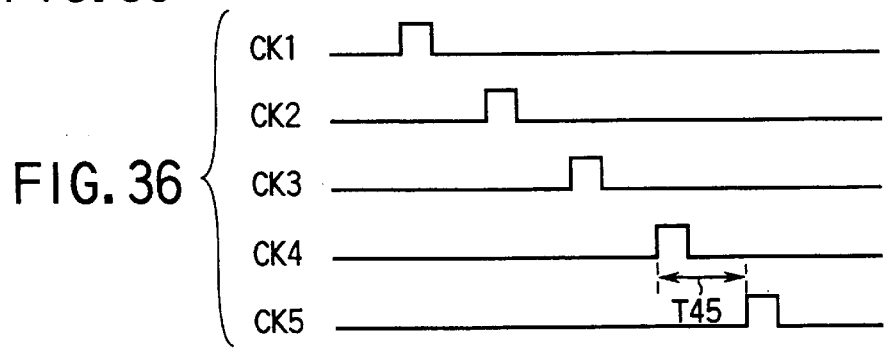
FIG. 35
FIG. 36
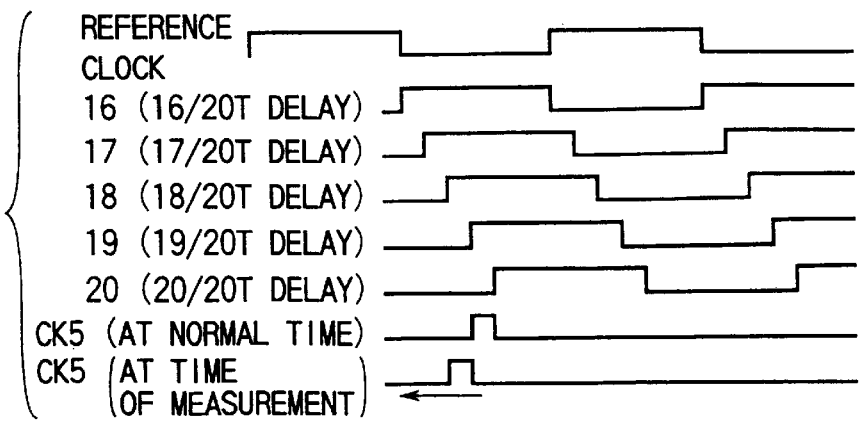
FIG. 37

FREQUENCY MULTIPLIER CIRCUIT OPERABLE WITH AN EXTERNAL REFERENCE CLOCK SIGNAL HAVING A FREQUENCY IN A WIDE RANGE

BACKGROUND OF THE INVENTION

The present invention relates to a frequency multiplier circuit used in semiconductor integrated circuits, and in particular to a frequency multiplier circuit used for a microcomputer requiring a clock signal having a frequency in the range of several MHz to several tens MHz.

Heretofore, a frequency multiplied signal of a clock signal supplied from the outside is generated by using a phase-locked loop (hereafter referred to as PLL) circuit. FIG. 9 shows an example of a conventional frequency multiplier circuit using a voltage controlled oscillator circuit.

As shown in FIG. 9, a voltage controlled oscillator circuit (VCO) 11 is, for example, a ring oscillator formed of a large number of stages of inverter circuits 12 connected in series. In other words, an output terminal of an inverter circuit of located at a final stage is connected to an input terminal of an inverter circuit located at a first stage. Each inverter circuit 12 is formed of an inverter 15, and control transistors 13 and 14 respectively supplied with control voltages VP and VN at respective gates. The delay value of the inverter circuit 12 is controlled by the control voltages VP and VN. As a result, the oscillation frequency of the voltage controlled oscillator circuit 11 is controlled. An oscillation signal CKOUT of the voltage controlled oscillator circuit 11 is output to the outside as a frequency multiplied clock signal, and supplied to an input terminal of a frequency divider circuit 16. The frequency divider circuit 16 divides the frequency of the oscillation signal CKOUT of the voltage controlled oscillator circuit 11 to 1/N, and outputs a resultant frequency divided signal. A first input terminal of a phase comparator (PC) 17 is supplied with the frequency divided signal. A second input terminal of the phase comparator 17 is supplied with an external reference clock signal CKIN. The phase comparator 17 detects a lead or lag of the phase between the frequency divided signal and the external reference clock signal, converts a result thereof to a pulse signal, and outputs the pulse signal as an error signal. The error signal is supplied to an input terminal of a low-pass filter (LPF) 18. The low-pass filter 18 outputs only the direct current component of the error signal. The output signal of the low-pass filter 18 is used as the control voltage VN of the voltage controlled oscillator circuit 11.

Furthermore, an output terminal of the low-pass filter 18 is connected to a gate of an N-channel MOS transistor 19. A source of the N-channel MOS transistor 19 is grounded. A drain of the N-channel MOS transistor 19 is connected to a drain and a gate of a P-channel MOS transistor 20. A source of the P-channel MOS transistor 20 is supplied with a power supply voltage. A drain potential of the N-channel MOS transistor 19 is used as the control voltage VP of the voltage controlled oscillator circuit 11. In this way, the control voltage VP is determined by using the control voltage VN.

In the circuit shown in FIG. 9, negative feedback control is conducted on the VCO 11 in such a direction as to make the external reference clock signal CKIN coincide with the output signal of the frequency divider circuit 16 in frequency and phase. As a result, the frequency multiplied clock signal CKOUT becomes an N frequency multiplied signal of the external reference clock signal CKIN.

FIG. 11 shows a circuit example of a frequency multiplier circuit using a voltage controlled delay circuit. As shown in FIG. 11, the external reference clock signal CKIN is supplied to an input terminal of a voltage controlled delay circuit 21. The voltage controlled delay circuit 21 is formed of a large number of inverter delay cell stages connected in series. A first terminal and a second terminal of the phase comparator (PC) 22 are supplied with an output signal of an inverter delay cell forming the final stage of the voltage controlled delay circuit 21 and the external reference clock signal CKIN, respectively. An output terminal of the phase comparator 22 is connected to an input terminal of the low-pass filter 23. An output terminal of the low-pass filter 23 is connected to a control voltage input terminal of the voltage controlled delay circuit 21. By this negative feedback loop, delay values of respective inverter delay cells of the voltage controlled delay circuit 21 are adjusted so as to make the output signal of the inverter delay cell forming the final stage of the voltage controlled delay circuit 21 coincide with the external reference clock signal CKIN in frequency and phase.

A logic circuit 24 has a plurality of input terminals. Those input terminals are connected to suitably selected output terminals of inverter delay cells forming the voltage controlled delay circuit 21. The logic circuit 24 outputs a plurality of pulse signals every period of the external reference clock signal CKIN. By suitably forming an internal circuit of the logic circuit 24, an output signal CKOUT of the logic circuit 24 can be made a clock signal frequency multiplied with respect to the reference clock signal CKIN.

When the PLL circuit has arrived at its stable state, therefore, the logic circuit 24 outputs the clock signal frequency multiplied with respect to the external reference clock signal.

In the PLL circuit shown in FIG. 9, the oscillation signal CKOUT of the voltage controlled oscillator circuit 11 has an oscillation frequency fVCO represented by the relation $$fVCO = N \times fIN$$

where fIN is the frequency of the external reference clock signal CKIN, and N is the frequency division factor of the frequency divider circuit 16. For example, if fIN is in the range of 1 MHz to 4 MHz, and N is in the range of 2 to 8, then fVCO needs to be in the range of 2 MHz to 32 MHz. In this way, the voltage controlled oscillator circuit is required to oscillate in a very wide range of frequency.

FIG. 10 shows a relation between the oscillation frequency of the voltage controlled oscillator circuit and the control voltage VN of the voltage controlled oscillator circuit.

As represented by a region 31 shown in FIG. 10, the oscillation frequency of the voltage controlled oscillator circuit saturates as the control voltage of the voltage controlled oscillator circuit becomes high. Therefore, a fixed upper limit exists in the control voltage. Furthermore, since the control voltage VN is applied to the gate terminal of the N-channel MOS transistor 19 as shown in FIG. 9, the voltage controlled oscillator circuit does not oscillate when the control voltage VN is lower than the threshold voltage of the N-channel MOS transistor 19. Therefore, a lower limit of the control voltage also exists. In this way, the control voltage range of the voltage controlled oscillator circuit becomes narrow.

On the other hand, it is necessary to conduct the design so as to provide the maximum oscillation frequency of the voltage controlled oscillator circuit with a considerably high value, considering the process dispersion and the power supply voltage range or the temperature range.

Typically in a narrow range of the control voltage, therefore, a wide range of the oscillation frequency is controlled. As represented by a region 32 of FIG. 10, therefore, the oscillation characteristic of the voltage controlled oscillator circuit becomes very steep.

For example, in the case where this voltage controlled oscillator circuit is incorporated in a MCU and noise is mixed in the control voltage, the oscillation frequency is significantly changed by the noise because the oscillation characteristic is steep. This results in a problem that it becomes impossible to obtain the stable frequency multiplied clock output.

If the frequency of the external reference clock signal CKIN changes in a wide range in the example of the conventional frequency multiplier circuit using the multistage voltage controlled delay circuit shown in FIG. 11, the delay value per inverter delay cell stage must be adjusted in a wide range. FIG. 12 shows the relation between the control voltage VN and the delay value in each inverter delay cell. In the inverter delay cell, a delay value smaller than a fixed value cannot be obtained as represented by a region 35. Furthermore, if the delay value becomes large, a change of the delay value with respect to a change of the control voltage becomes very large as in the region 33. If noise is mixed in the control voltage, therefore, the delay value of the delay circuit changes largely. This results in a drawback that a stable frequency multiplied clock signal is not output.

A change of the frequency or pulse width caused in the frequency multiplied clock signal by noise as described above is called jitter. A change of the phase caused in the frequency multiplied clock signal is called phase error. The performance of the frequency multiplier circuit largely depends upon whether the jitter and phase error is large or small. For example, in the case where a frequency multiplier circuit is used in a microcomputer, jitter or a phase error causes false operation or runaway. Furthermore, in the case where the frequency multiplier circuit is applied to liquid crystal TV sets and the frequency multiplied clock signal is used as a clock signal for sampling a video signal every horizontal pixel, flicker, fluctuation, or the like of the picture is caused.

In the conventional frequency multiplier circuit, a voltage controlled oscillator circuit having a wide frequency range allowing oscillation or inverter delay cells having a delay value which can be controlled in a wide range are needed. This results in a problem that the sensitivity of the frequency multiplied clock signal with respect to the noise is increased.

BRIEF SUMMARY OF THE INVENTION

In view of the above described subjects, the present invention has been made. An object of the present invention is to provide a frequency multiplier circuit which operates with an external reference clock signal having a frequency in a wide range and which is suppressed in sensitivity with respect to noise.

The above described problems are solved by the present invention. In accordance with a first aspect of the present invention, a frequency multiplier circuit comprising: a voltage controlled delay circuit controlled by a control voltage, including delay cells of plural stages connected in series, an input terminal of a delay cell of a first stage being supplied with a reference clock signal; a selection circuit supplied with at least a part of output signals of the delay cells of plural stages at input thereof, the selection circuit conducting a selection out of the signals inputted from the delay cells and outputting the selected signal, according to a first setting signal for setting a frequency multiplication factor and a second setting signal for setting a frequency range of the reference clock signal; a phase comparator supplied with the output signal of the selection circuit at a first input terminal and supplied with the reference clock signal at a second input terminal; a low-pass filter having an input terminal connected to an output terminal of the phase comparator, and an output terminal connected to an input terminal of control voltage of the voltage controlled delay circuit; and a waveform generation circuit supplied with at least a part of output signals of the delay cells of plural stages at input thereof, the waveform generation circuit generating and outputting a frequency multiplied clock signal from signals input from the delay cells according to the first setting signal and the second setting signal. In the frequency multiplier circuit according to the first aspect of the present invention, the delay cells have delay values changed according to the control voltage, and the delay cells operate in such a region that a change of the delay value caused by noise of the control voltage is small. In the frequency multiplier circuit according to the first aspect of the present invention, the selection circuit and the waveform generation circuit are formed of digital logic circuits. In the frequency multiplier circuit according to the first aspect of the present invention, the reference clock signal has a frequency in the range of 2 to 16 MHz, and the frequency multiplied clock signal has a frequency in the range of 2 to 64 MHz.

In accordance with a second aspect of the present invention, a frequency multiplier circuit comprising: a voltage controlled delay circuit controlled by a control voltage, including delay cells of plural stages connected in series, an input terminal of a delay cell of a first stage being supplied with a reference clock signal; a phase comparator supplied with an output signal of a delay cell of a final stage at a first input terminal and supplied with the reference clock signal at a second input terminal; a low-pass filter having an input terminal connected to an output terminal of the phase comparator, and an output terminal connected to an input terminal of control voltage of the voltage controlled delay circuit; and a generation circuit supplied with at least a part of output signals of the delay cells of plural stages at input thereof, the generation circuit generating a pulse signal having a fixed pulse width shorter than a period of the reference clock signal for controlling operation of a semiconductor memory. In the frequency multiplier circuit according to the second aspect of the present invention, the delay cells have delay values changed according to the control voltage, and the delay cells operate in such a region that a change of the delay value caused by noise of the control voltage is small. In the frequency multiplier circuit according to the second aspect of the present invention, the generation circuit is formed of digital logic circuits. In the frequency multiplier circuit according to the second aspect of the present invention, the reference clock signal has a frequency in the range of 2 to 16 MHz.

In accordance with a third aspect of the present invention, a frequency multiplier circuit comprising: a voltage controlled delay circuit controlled by a control voltage, including delay cells of plural stages connected in series, an input terminal of a delay cell of a first stage being supplied with a reference clock signal; a phase comparator supplied with an output signal of a delay cell of a final stage at a first input terminal and supplied with the reference clock signal at a second input terminal; a low-pass filter having an input terminal connected to an output terminal of the phase comparator, and an output terminal connected to an input terminal of control voltage of the voltage controlled delay circuit; and a generation circuit supplied with a plurality of output signals of the delay cells of plural stages at input thereof, the generation circuit generating a signal of a different frequency according to a frequency selection signal. In the frequency multiplier circuit according to the third aspect of the present invention, the delay cells have delay values changed according to the control voltage, and the delay cells operate in such a region that a change of the delay value caused by noise of the control voltage is small. In the frequency multiplier circuit according to the third aspect of the present invention, the generation circuit is formed of digital logic circuits. In the frequency multiplier circuit according to the third aspect of the present invention, the reference clock signal has a frequency in the range of 2 to 16 MHz.

In accordance with a fourth aspect of the present invention, a frequency multiplier circuit comprising: a voltage controlled delay circuit controlled by a control voltage, including delay cells of plural stages connected in series, an input terminal of a delay cell of a first stage being supplied with a reference clock signal; a phase comparator supplied with an output signal of a delay cell of a final stage at a first input terminal and supplied with the reference clock signal at a second input terminal; a low-pass filter having an input terminal connected to an output terminal of the phase comparator, and an output terminal connected to an input terminal of control voltage of the voltage controlled delay circuit; a plurality of generation circuits each supplied with a plurality of output signals of the delay cells of plural stages at input thereof, the generation circuits generating signals of different frequencies, respectively; a selection circuit for conducting a selection out of output signals of the plurality of generation circuits according to a frequency selection signal; and a control circuit for controlling output timing of the frequency selection signal according to one of the output signals of the delay cells of plurality of stages. In the frequency multiplier circuit according to the fourth aspect of the present invention, the delay cells have delay values changed according to the control voltage, and the delay cells operate in such a region that a change of the delay value caused by noise of the control voltage is small. In the frequency multiplier circuit according to the fourth aspect of the present invention, the generation circuits are formed of digital logic circuits. In the frequency multiplier circuit according to the fourth aspect of the present invention, the reference clock signal has a frequency in the range of 2 to 16 MHz.

In accordance with a fifth aspect of the present invention, a frequency multiplier circuit comprising: a voltage controlled delay circuit controlled by a control voltage, including delay cells of plural stages connected in series, an input terminal of a delay cell of a first stage being supplied with a reference clock signal; a phase comparator supplied with an output signal of a delay cell of a final stage at a first input terminal and supplied with the reference clock signal at a second input terminal; a low-pass filter having an input terminal connected to an output terminal of the phase comparator, and an output terminal connected to an input terminal of control voltage of the voltage controlled delay circuit; and a generation circuit supplied with a plurality of output signals of the delay cells of plural stages at input thereof, the generation circuit generating a plurality of clock signals of different timing corresponding to operations of respective macro blocks forming a microcomputer. In the frequency multiplier circuit according to the fifth aspect of the present invention, the delay cells have delay values changed according to the control voltage, and the delay cells operate in such a region that a change of the delay value caused by noise of the control voltage is small. In the frequency multiplier circuit according to the fifth aspect of the present invention, the generation circuit is formed of digital logic circuits. In the frequency multiplier circuit according to the fifth aspect of the present invention, the reference clock signal has a frequency in the range of 2 to 16 MHz.

In accordance with a sixth aspect of the present invention, a frequency multiplier circuit comprising: a voltage controlled delay circuit controlled by a control voltage, including delay cells of plural stages connected in series, an input terminal of a delay cell of a first stage being supplied with a reference clock signal; a phase comparator supplied with an output signal of a delay cell of a final stage at a first input terminal and supplied with the reference clock signal at a second input terminal; a low-pass filter having an input terminal connected to an output terminal of the phase comparator, and an output terminal connected to an input terminal of control voltage of the voltage controlled delay circuit; and a plurality of generation circuits for generating clock signals provided so as to respectively correspond to latch circuits for latching output signals of a plurality of macro blocks forming a microcomputer, the clock signals controlling operations of the latch circuits, wherein when measuring operation speed of the macro blocks, the generation circuit supplies clock signals of different timing to latch circuits for latching the output signals of macro blocks to be measured, according to a plurality of output signals of the delay cells of plural stages. In the frequency multiplier circuit according to the sixth aspect of the present invention, the delay cells have delay values changed according to the control voltage, and the delay cells operate in such a region that a change of the delay value caused by noise of the control voltage is small. In the frequency multiplier circuit according to the sixth aspect of the present invention, the generation circuits are formed of digital logic circuits. In the frequency multiplier circuit according to the sixth aspect of the present invention, the reference clock signal has a frequency in the range of 2 to 16 MHz.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a diagram showing a conventional frequency multiplier circuit using a voltage controlled oscillator circuit;

FIG. 10 is a diagram showing the relation between a control voltage and an oscillation frequency in a voltage controlled oscillator circuit;

FIG. 11 is a diagram showing a conventional frequency multiplier circuit using a voltage controlled delay circuit;

FIG. 12 is a diagram showing the relation between the control voltage and a delay value in the voltage controlled delay circuit;

FIG. 34 is a circuit diagram schematically showing the configuration of a voltage controlled delay circuit applied to the sixth embodiment;

FIG. 35 is a circuit diagram showing a part of the circuit shown in FIG. 33;

FIG. 36 is a timing diagram showing schematic operation of the circuit shown in FIG. 33; and FIG. 37 is a timing diagram showing operation of the circuit shown in FIG. 35.

DETAILED DESCRIPTION OF THE INVENTION

Figure 1:
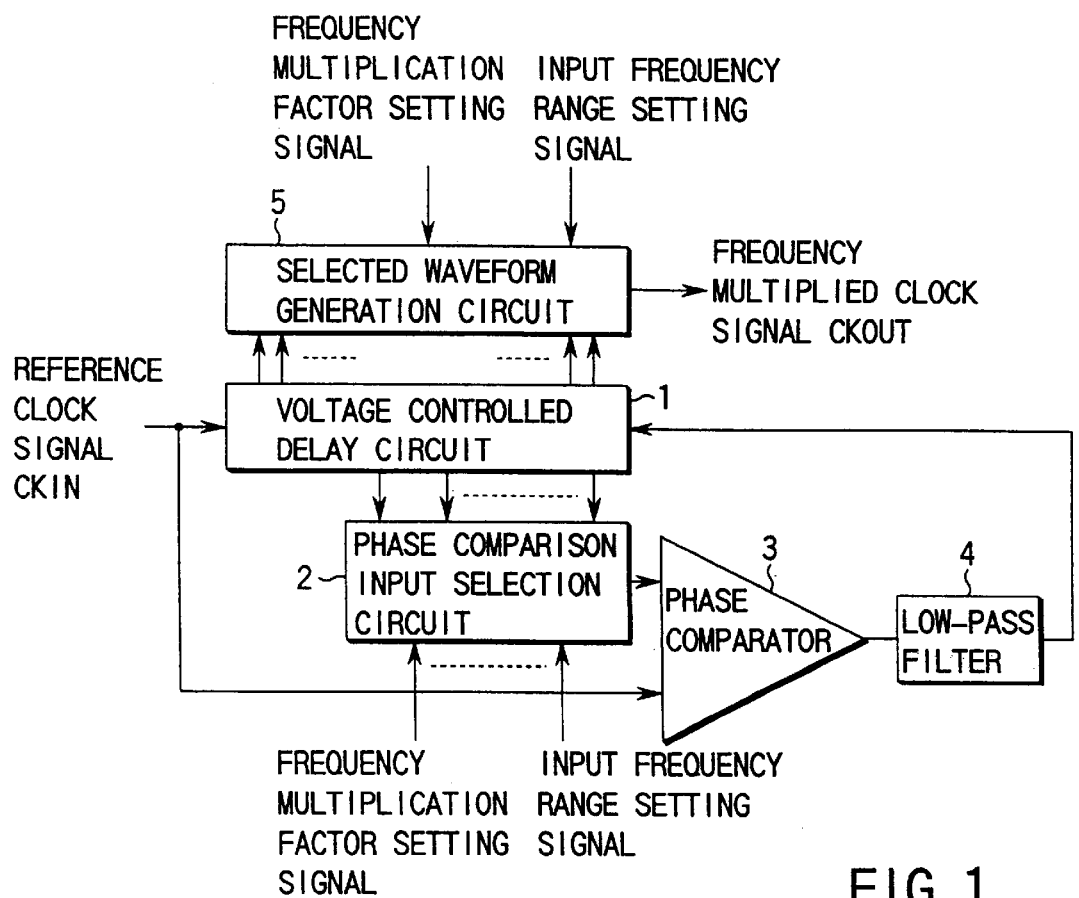
FIG. 1 is a diagram showing an embodiment of the present invention.

Hereafter, embodiments of the present invention will be described by referring to the drawing.

FIG. 1 shows an embodiment of the present invention. This frequency multiplier circuit includes a voltage controlled delay circuit 1, a phase comparison input selection circuit 2, a phase comparator 3, a low-pass filter 4, and a selected waveform generation circuit 5. Hereafter, the same components are denoted by like characters, and duplicated description thereof will be omitted.

The voltage controlled delay circuit 1 is formed of, for example, N delay cell stages connected in series. An external reference clock signal CKIN is supplied to an input terminal of the voltage controlled delay circuit 1, that is, an input terminal of a delay cell forming a first stage. In the voltage controlled delay circuit 1, the delay value of the delay cell of each stage can be controlled by using a potential supplied to its control voltage terminal.

At least a part of output terminals of delay cell stages forming the voltage controlled delay circuit 1 are connected to input terminals of the phase comparison input selection circuit 2. The phase comparison input selection circuit 2 is supplied with a frequency multiplication factor setting signal and an input frequency range setting signal. Depending on the frequency multiplication factor setting signal and the input frequency range setting signal, the phase comparison input selection circuit 2 selects and outputs a part of output signals of delay cells.

A first input terminal of the phase comparator 3 is supplied with an output signal of the phase comparison input selection circuit 2. A second input terminal of the phase comparator 3 is supplied with the external reference clock signal CKIN. The phase comparator 3 outputs a pulse signal depending upon a phase difference between the external reference clock signal CKIN and the output signal of phase comparison input selection circuit 2, as an error signal.

An input terminal of the low-pass filter 4 is supplied with this error signal. An output terminal of the low-pass filter 4 is connected to the control voltage terminal of the voltage controlled delay circuit 1.

Input terminals of the selected waveform generation circuit 2 are connected to at least a part of output terminals of respective delay cell stages forming the voltage controlled delay circuit 1. Furthermore, the selected waveform generation circuit 2 is supplied with the frequency multiplication factor setting signal and the input frequency range setting signal. According to the frequency multiplication factor setting signal and the input frequency range setting signal, the selected waveform generation circuit 5 generates a waveform from the output signals of the delay cells, and outputs the generated waveform as a frequency multiplied clock signal CKOUT.

Figure 2:
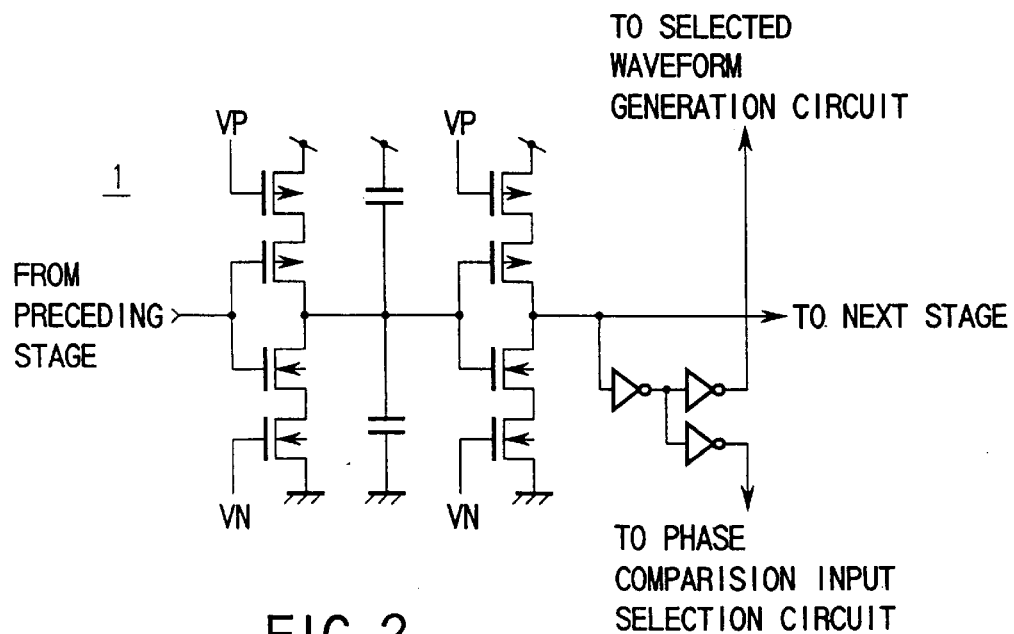
FIG. 2 is a diagram showing an example of a circuit of a delay cell forming a voltage controlled delay circuit.

FIG. 2 shows an example of a circuit of a delay cell of one stage included in the voltage controlled delay circuit 1. FIG.

Figure 3:
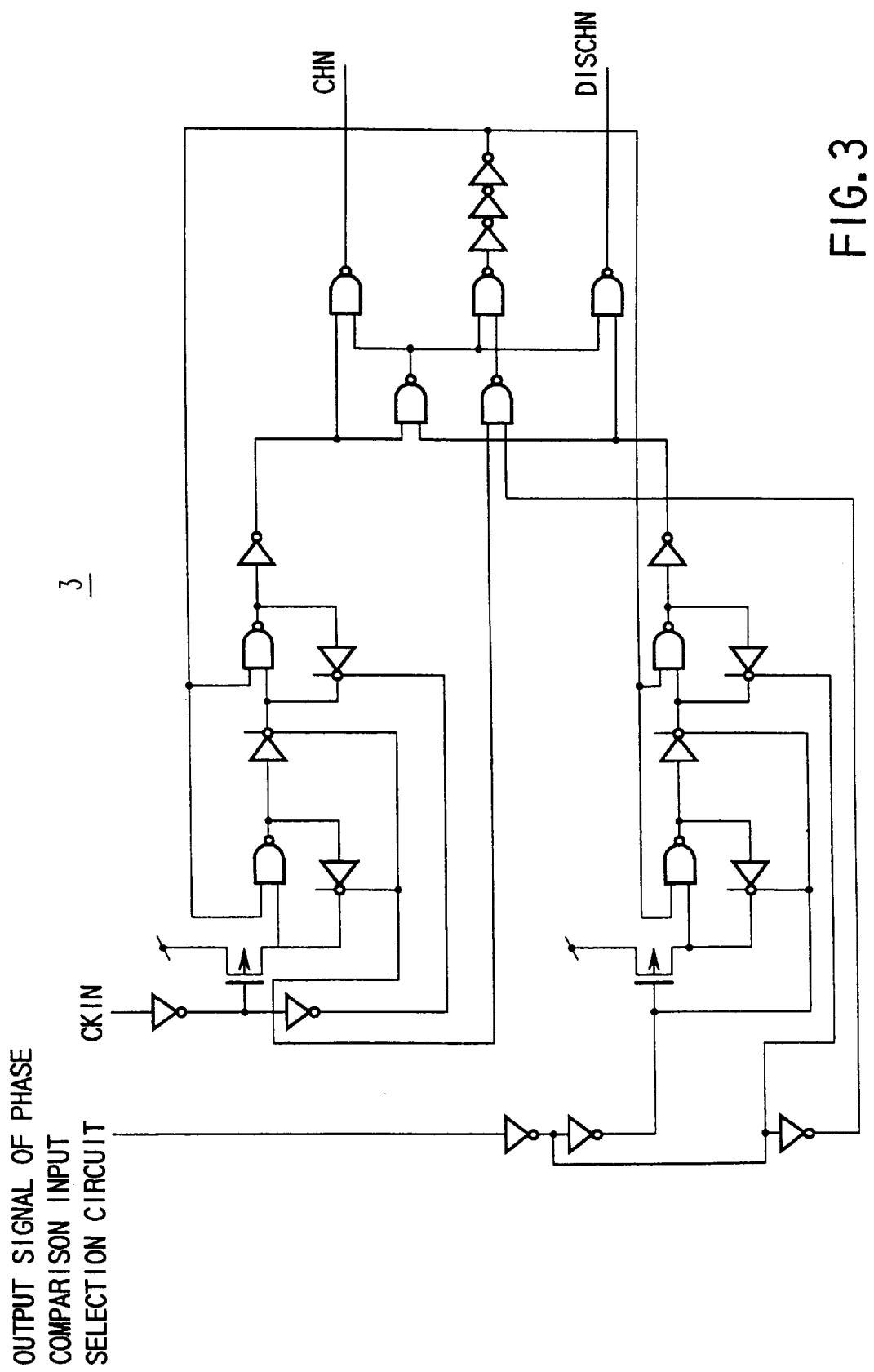
FIG. 3 is a diagram showing an example of a circuit of a phase comparator.
Figure 4:
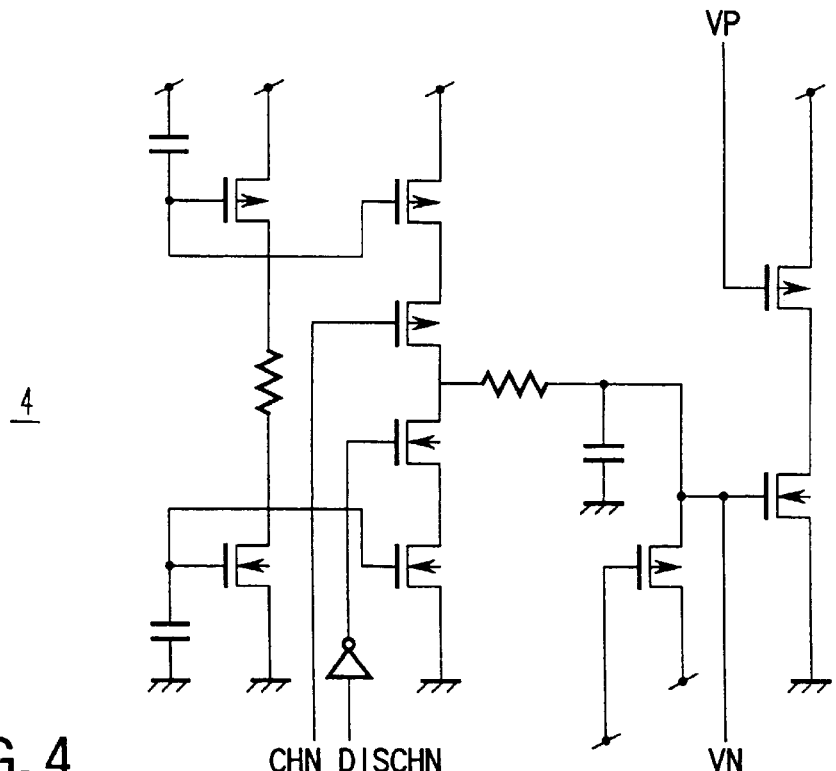
FIG. 4 is a diagram showing an example of a circuit of a low-pass filter.

3 shows an example of a circuit of the phase comparator 3. In FIG. 3, CHN and DISCHN represent error signals. FIG. 4 shows an example of a circuit of the low-pass filter 4.

Figure 5:
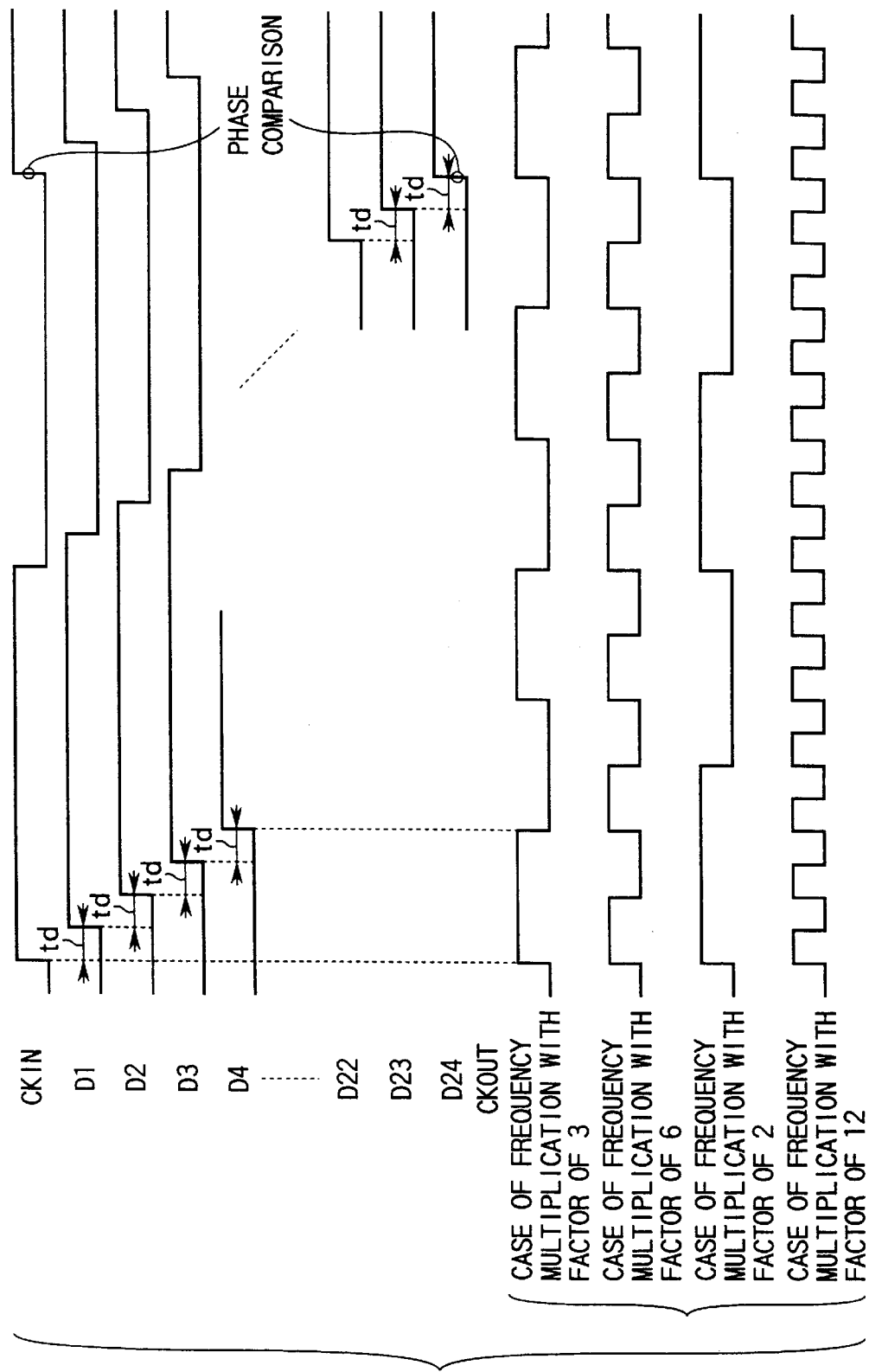
FIG. 5 is a diagram showing the operation of the embodiment shown in FIG. 1 in the case where a frequency multiplication factor is changed.

Operation of the circuit shown in FIG. 1 will now be described. FIG. 5 is an operation waveform diagram of the circuit shown in FIG. 1.

In the voltage controlled delay circuit 1 formed of N stages of delay cells, an output signal of a delay cell of a first stage supplied with the external reference clock signal CKIN is denoted by D1, and an output signal of a delay cell of the next stage is denoted by D2. Thus, an output signal of a delay cell of the final stage is denoted by DN. A delay value in each delay cell is represented as td.

The phase comparison input selection circuit 2 outputs, for example, the signal DN. Therefore, negative feedback control is effected so as to make a rising edge of the signal DN coincide with a rising edge of the external reference clock signal CKIN. When a stable state is reached as shown in FIG. 5, rising edges of respective output signals of N stages of delay cells distribute in one period of the external reference clock signal CKIN at equal intervals.

It is now assumed that N=24 and the signals D1 to D24 are supplied to the selected waveform generation circuit 5. In the case where frequency multiplication by a factor of 3 is set by the frequency multiplication factor setting signal, the selected waveform generation circuit 5 uses rising edges of the signals CKIN, D4, D8, D12, D16 and D20 to generate and output a frequency multiplied clock signal CKOUT which is a signal multiplied in frequency with respect to the signal CKIN by a factor of 3. In this case, the selected waveform generation circuit 5 conducts a logical operation represented as CKIN·(/D4)+D8·(/D12)+D12·(/D16)+D16+(/D20). Hereafter, / represents an inverted signal. Furthermore, in the case where frequency multiplication by a factor of 12 is selected, the selected waveform generation circuit 5 conducts a logical operation represented as CKIN·(/D1)+D2·(/D3)+. . . +D22·(/D23) and thereby generates and outputs a frequency multiplied clock signal CKOUT which is a signal multiplied in frequency with respect to the reference clock signal CKIN by a factor of 12. Besides, a frequency multiplied signal by a factor of 2 or a frequency multiplied signal by a factor of 6 can be generated by the selected waveform generation circuit as shown in FIG. 5.

Such a selected waveform generation circuit conducting a plurality of logical operations differing depending on frequency multiplication factor can be formed easily by using a digital circuit.

Thus, in the present embodiment, frequency multiplied clock signals having different frequency multiplication factors can be obtained by changing the operation of the selected waveform generation circuit 5. Unlike the conventional technique, it becomes unnecessary to change the delay value of the delay circuit according to a frequency multiplication factor changeover. As a result, it becomes possible to use the voltage controlled delay circuit in a region 34 shown in FIG. 12, that is, in such a region that the delay value can be controlled easily and the influence of the noise is slight. The performance of the frequency multiplier circuit can be improved.

By referring to FIGS. 6, 7A and 7B, operation of the present embodiment in the case where the frequency of the external reference clock signal changes will now be described. It is now assumed that the number N of delay cell stages is 24.

Figure 6:
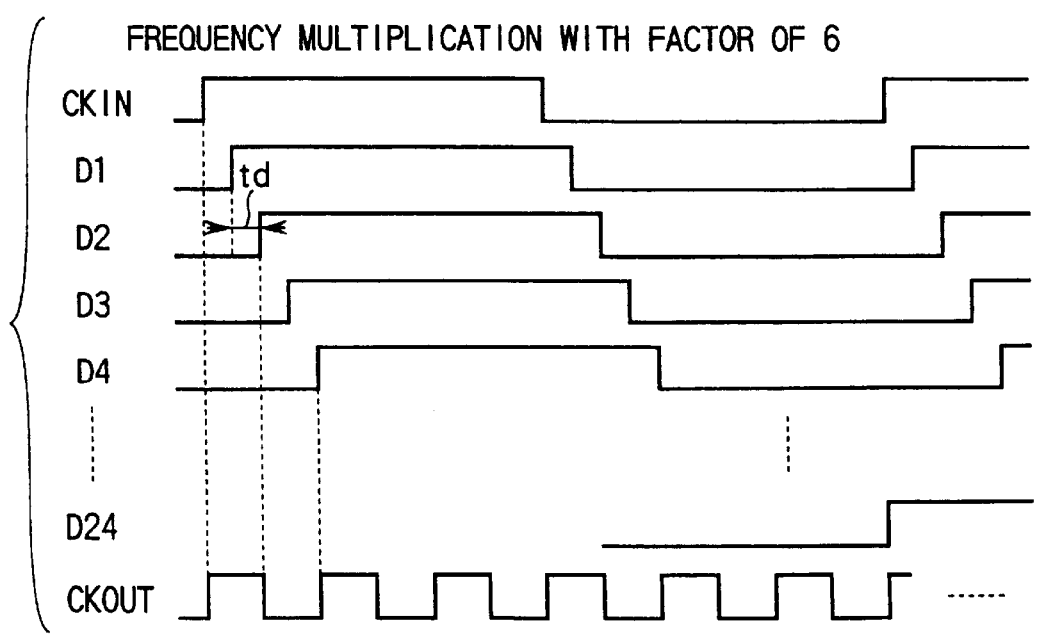
FIG. 6 is a diagram showing the operation of the embodiment shown in FIG. 1 in the case where a reference clock frequency is changed.

FIG. 6 shows the operation in the case where the frequency fCKIN of the external reference clock signal CKIN is f0 and a signal multiplied in frequency by a factor of 6 is to be obtained. The phase comparison input selection circuit 2 supplies the signal D24 to the phase comparator 3. It is now assumed that the delay value of each delay cell is set to td1 which is an operation point where the controllability is the best and the influence of noise is slight.

Figure 7A:
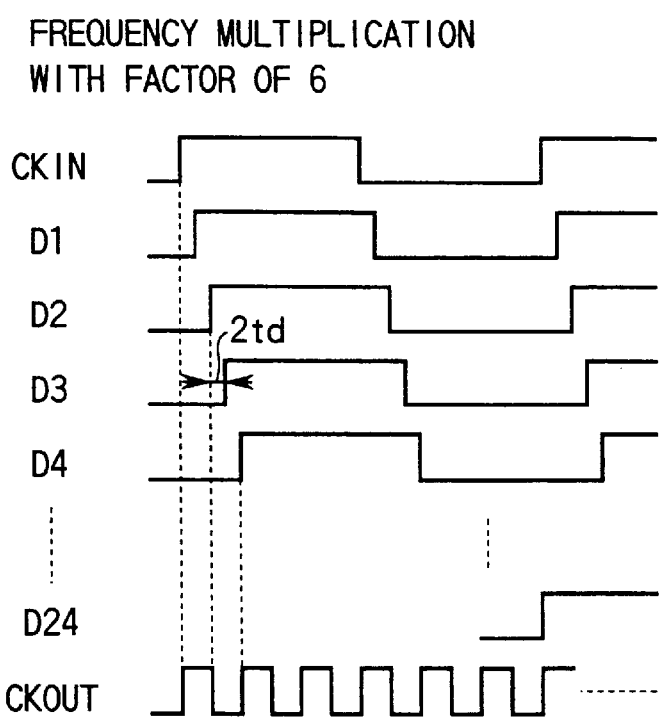
FIGS. 7A and 7B are diagrams showing, in the wake of FIG. 6, the operation of the embodiment shown in FIG. 1 in the case where the reference clock frequency is changed.

FIG. 7A shows the operation in the case where the frequency of the reference clock signal is doubled as compared with the example shown in FIG. 6. The frequency multiplication factor remains at 6, and the logic of the selected waveform generation circuit is also the same as that of the case shown in FIG. 6. Furthermore, the phase comparison input selection circuit 2 also outputs the signal D24. In this case, the delay value of each stage becomes td2, which is half of td1. Therefore, the delay controllability becomes worse than the case shown in FIG. 6, but remains in a considerably favorable region.

Figure 7B:
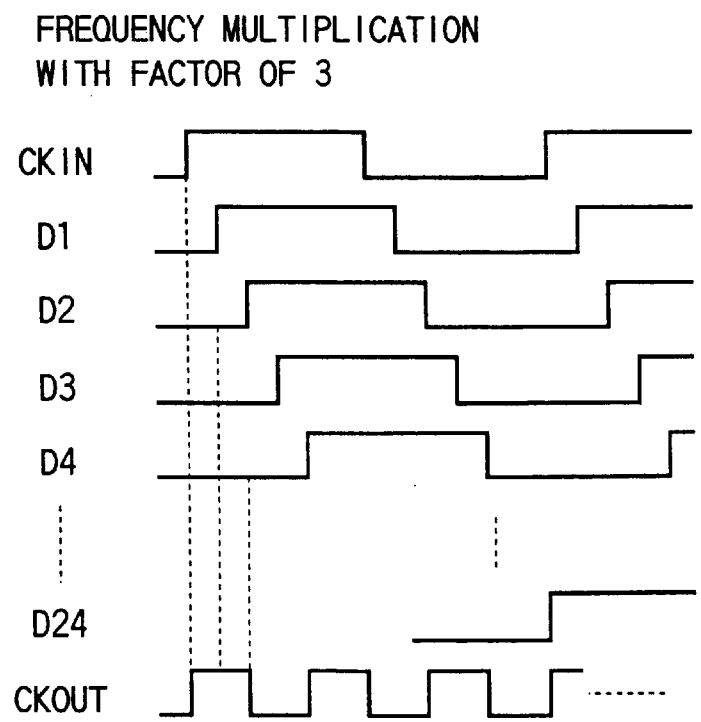

FIG. 7B shows operation of the case where the reference clock frequency is the same as that of the case shown in FIG. 7A, that is, 2f0, and the frequency multiplication factor is 3. In this case, the phase comparison input selection circuit 2 outputs the signal D12 to the phase comparator 3. Therefore, the delay value of each delay cell becomes td1 which is the same as that of the case shown in FIG. 6, and the controllability of the delay value becomes favorable. The selected waveform generation circuit 5 conducts the same logical operation as the cases shown in FIG. 6 and FIG. 7A. In this case, the selected waveform generation circuit 5 does not use the signals D12 to D24.

Even if the reference clock frequency changes, the change of the delay value in delay cells forming the voltage controlled delay circuit can thus be made small by changing the output signal of the phase comparison input selection circuit 2. As a result, it becomes possible to use the voltage controlled delay circuit in a region 34 shown in FIG. 12, that is, in such a region that the delay value can be controlled easily and the influence of the noise is slight. The performance of the frequency multiplier circuit can be improved.

Figure 8:
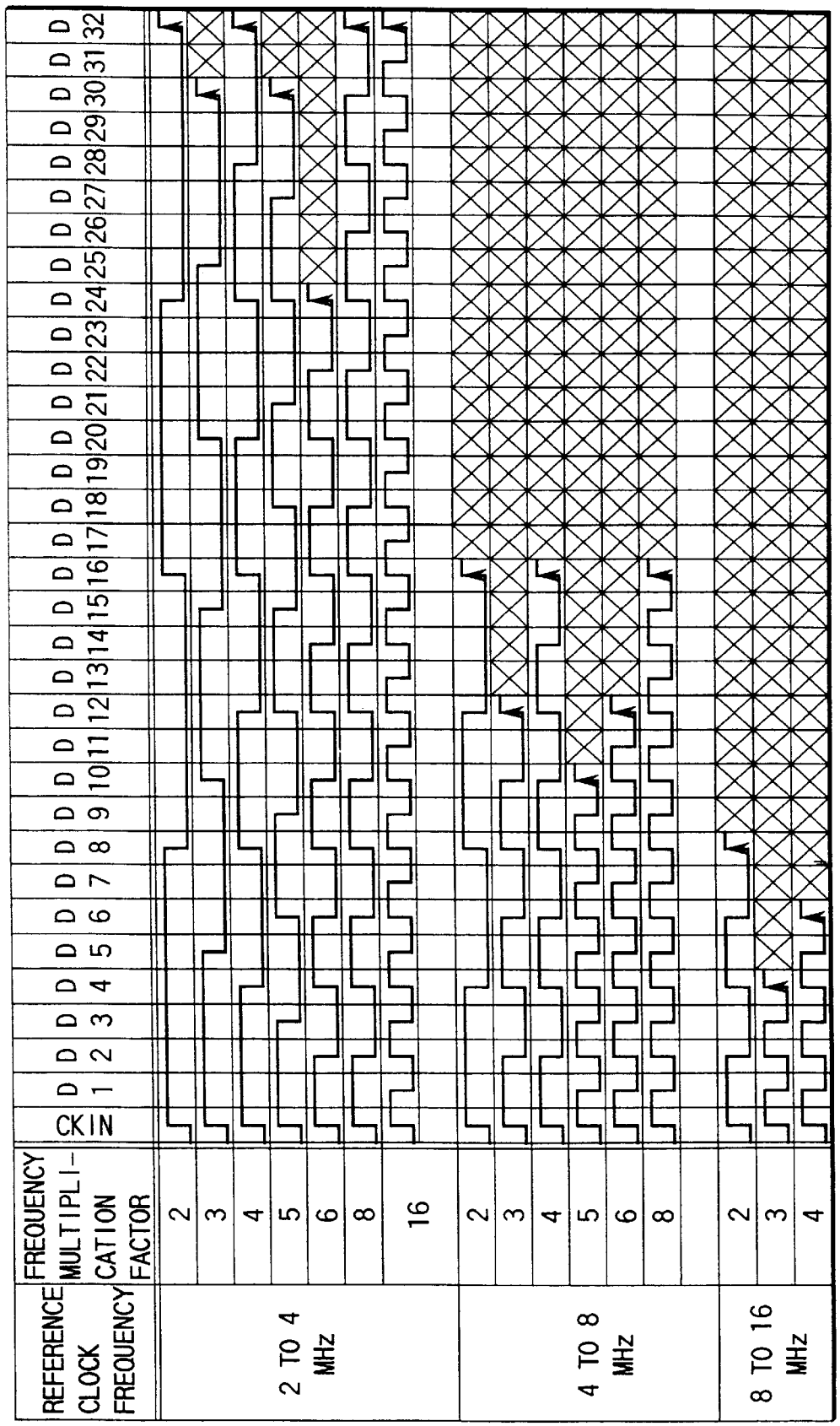
FIG. 8 is a diagram for description of the operation of the embodiment shown in FIG. 1 in the case where the reference clock frequency and the frequency multiplication factor is changed.

Operation of the embodiment shown in FIG. 1 corresponding to a frequency change of the reference clock signal and a change of the frequency multiplication factor will be described concretely and in detail. FIG. 8 shows waveforms of the frequency multiplied clock signal CKOUT for various reference clock frequencies and frequency multiplication factors.

It is now assumed that the reference clock frequency is in the range of 2 MHz to 16 MHz and the frequency multiplication factor is changed over among 2, 3, 4, 5, 6, 8 and 16 at maximum. The input frequency range setting signal represents whether the frequency of the reference clock signal CKIN is in the range of 2 to 4 MHz, 4 to 8 MHz, or 8 to 16 MHz. The input frequency range setting signal is supplied to the selected waveform generation circuit 5 and the phase comparison input selection circuit 2. Furthermore, in the case where the frequency of the reference clock signal is in the range of 2 to 4 MHz, the frequency multiplication factor setting signal represents a frequency multiplication factor selected out of 2, 3, 4, 5, 6, 8 and 16. In the case where the frequency of the reference clock signal is in the range of 4 to 8 MHz, the frequency multiplication factor setting signal represents a frequency multiplication factor selected out of 2, 3, 4, 5, 6 and 8. In the case where the frequency of the reference clock signal is in the range of 8 to 16 MHz, the frequency multiplication factor setting signal represents a frequency multiplication factor selected out of 2, 3 and 4. The frequency multiplication factor setting signal is supplied to the selected waveform generation circuit 5 and the phase comparison input selection circuit 2.

The voltage controlled delay circuit 1 is formed of 32 delay cell stages to output delay signals D1 to D32.

According to the input frequency range setting signal and the frequency multiplication factor setting signal, the phase comparison input selection circuit 2 selects one of the delay signals D1 to D32 and outputs the selected signal to the phase comparator 3. In other words, the phase comparison input selection circuit 2 outputs an output signal of a delay cell corresponding to a rising edge provided with an arrow in the operation waveform shown in FIG. 8. For example, when the reference clock frequency is in the range of 2 to 4 MHz and the frequency multiplication factor is 2, the phase comparison input selection circuit 2 outputs the signal D32. When the reference clock frequency is in the range of 4 to 8 MHz and the frequency multiplication factor is 3, the phase comparison input selection circuit 2 outputs the signal D12.

According to the input frequency range setting signal and the frequency multiplication factor setting signal, the selected waveform generation circuit 5 generates the frequency multiplied clock signal by using a part or all of the delay signals D1 to D32. Each of rising edges of signals in FIG. 8 indicates that the selected waveform generation circuit 5 generates a rising edge of the output signal CKOUT by using a rising edge of an output signal of that stage. In the same way, each of falling edges of signals in FIG. 8 indicates that the selected waveform generation circuit 5 generates a falling edge of the output signal CKOUT by using a falling edge of an output signal of a delay cell corresponding thereto.

For example, when the reference clock frequency is in the range of 2 to 4 MHz and the frequency multiplication factor is 2, the selected waveform generation circuit 5 generates rising edges of the frequency multiplied clock signal CKOUT by using a rising edge of the signal CKIN and a rising edge of D16, and generates falling edges of the frequency multiplied clock signal CKOUT by using a rising edge of the signal D8 and a rising edge of D24. In the same way, when the reference clock frequency is in the range of 4 to 8 MHz and the frequency multiplication factor is 3, the selected waveform generation circuit 5 generates rising edges of the frequency multiplied clock signal CKOUT by using a rising edge of the signal CKIN, a rising edge of D4 and a rising edge of D8, and generates falling edges of the frequency multiplied clock signal CKOUT by using a rising edge of the signal D2, a rising edge of the signal D6 and a rising edge of D10.

By the way, output signals of the delay cells corresponding to X-marked portions shown in FIG. 8 are not used by the selected waveform generation circuit.

A frequency multiplied clock signal in the range of 2 to 64 MHz is thus generated from a reference clock signal in the range of, for example, 2 to 16 MHz.

In this way, by making the phase comparison input selection circuit and selected waveform generation circuit suitably operate according to the reference clock frequency and the frequency multiplication factor, the delay value of the voltage controlled delay circuit can be put in such a region as to provide favorable controllability and noise resistance. As a result, jitter and the phase error can be made small.

A second embodiment of the present invention will now be described. In this embodiment, the present invention is applied to a control circuit of a DRAM (dynamic random access memory). In the DRAM, various control signals are used.

Figure 13:
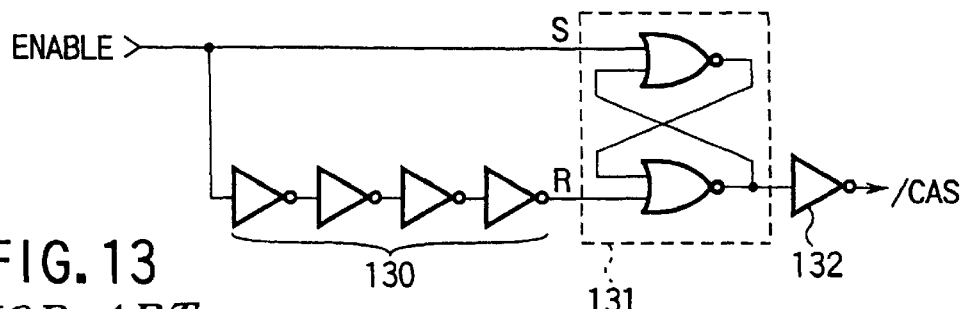
FIG. 13 is a circuit diagram showing a conventional circuit for generating a /CAS signal.
Figure 14:
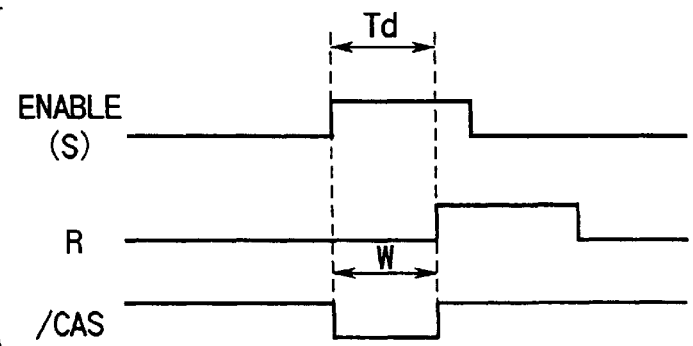
FIG. 14 is a timing diagram showing the operation of the circuit shown in FIG. 13.

FIG. 13 shows a conventional circuit for generating a /CAS (column address strobe) signal. This circuit is formed of a delay circuit 130 having a plurality of inverter circuits connected in series, a flip-flop circuit 131, and an inverter circuit 132. As shown in FIG. 14, this circuit controls the flip-flop circuit 131 according to an enable signal ENABLE and the enable signal delayed in the delay circuit 130 by a predetermined time, and thereby generates the /CAS signal. In this circuit, however, it is difficult to set a fixed delay time Td in the delay circuit 130 because of errors in production of a plurality of inverter circuits. As a result, a pulse width W (=Td) of the /CAS signal is not fixed. If the width of the /CAS signal becomes longer, the maximum frequency fmax of the DRAM is lowered, resulting in a problem of a prolonged access time. Therefore, it is important to generate the /CAS signal having an accurate pulse width.

Figure 15:
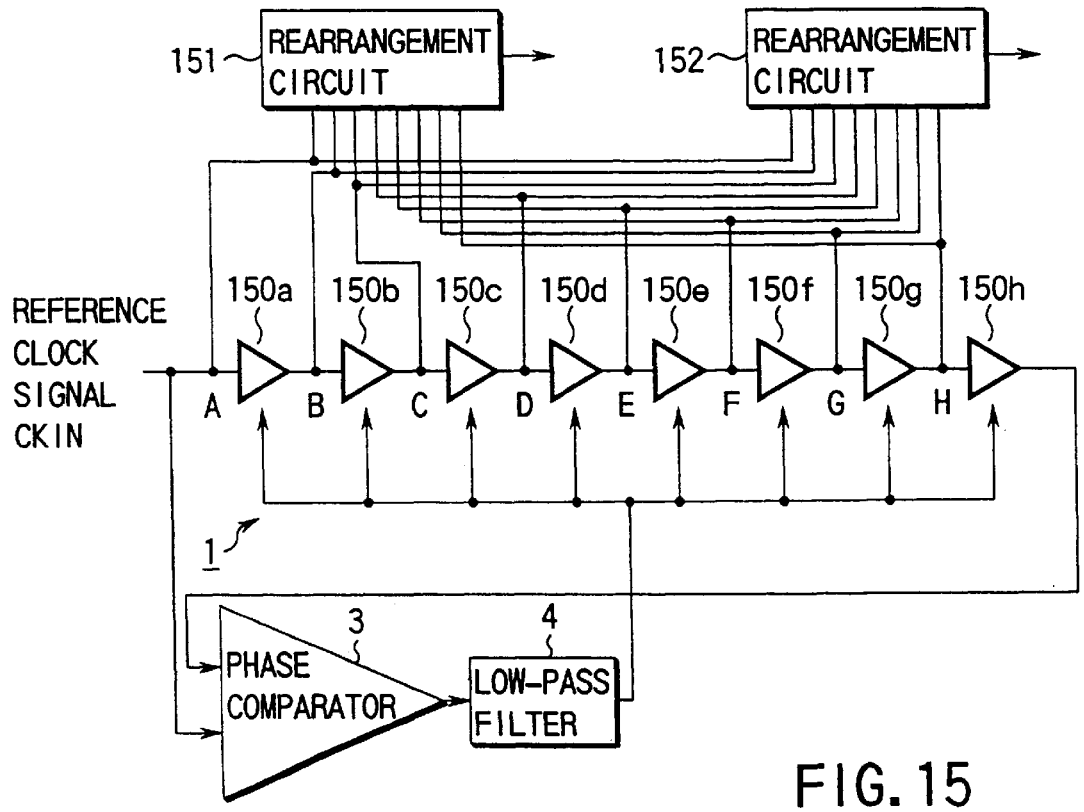
FIG. 15 is a circuit diagram showing a second embodiment of the present invention.

In the second embodiment, the /CAS signal is generated by a circuit shown in FIG. 15. In FIG. 15, the same components as those of FIG. 1 are denoted by like characters. Only different components will be described.

In FIG. 15, the voltage controlled delay circuit 1 is formed of delay cells 150a, 150b, . . . , 150h connected in series. The number of the delay cells is not limited to 8, but may exceed 8. Input terminals A to H of the delay cells 150a to 150h are connected to rearrangement circuits 151 and 152. The rearrangement circuit 151 generates the /CAS signal, and the rearrangement circuit 152 generates a clock signal used, for example, in the DRAM. As for this embodiment, only the rearrangement circuit 151 will now be described.

Figure 16:
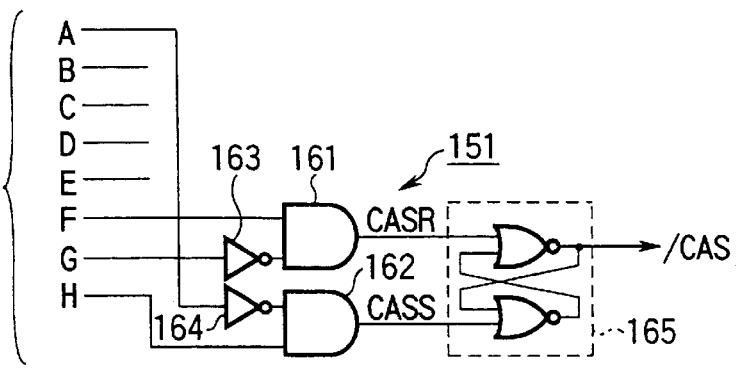
FIG. 16 is a circuit diagram showing an example of a rearrangement circuit shown in FIG. 15.

FIG. 16 shows the configuration of the rearrangement circuit 151. The rearrangement circuit 151 generates the /CAS signal by using the signals of, for example, the input terminals A, F, G and H of the delay cells 150a, 150f, 150g and 150h. In other words, the rearrangement circuit 151 is formed of AND circuits 161 and 162, inverter circuits 163 and 164, and a flip-flop circuit 165. The input terminal F is connected to one input end of the AND circuit 161. The input terminal G is connected to the other input end of the AND circuit 161 via the inverter circuit 163. The input terminal A is connected to one input end of the AND circuit 162 via the inverter circuit 164. The input terminal H is connected to the other input end of the AND circuit 162. From an output terminal of the AND circuit 161, a reset signal CASR for the flip-flop circuit 165 is output. From an output terminal of the AND circuit 162, a set signal CASS for the flip-flop circuit 165 is output.

Figure 18:
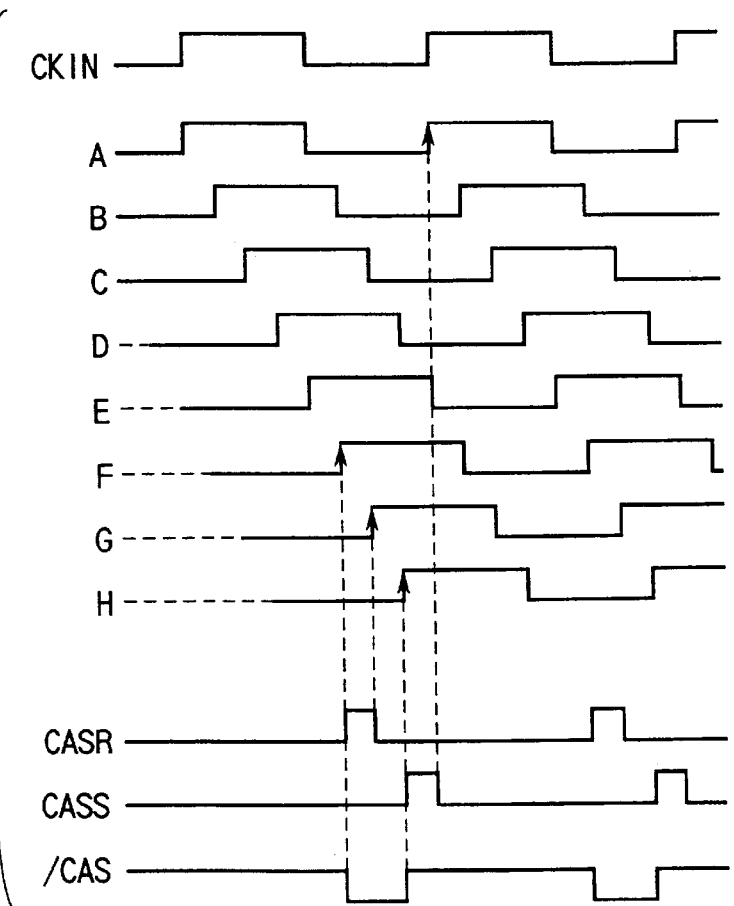
FIG. 18 is a timing diagram showing the operation of the circuit shown in FIG. 16.

FIG. 18 shows the operation of the circuit of FIG. 16. The AND circuit 161 outputs the reset signal CASR in response to the signals of the input terminals F and G. The AND circuit 162 outputs the reset signal CASS in response to the signals of the input terminals A and F. As a result, the flip-flop circuit 165 outputs the /CAS signal which falls in response to the reset signal CASR and which rises in response to the set signal CASS.

In the present embodiment, the set signal CASS and the reset signal CASR are generated by using accurately controlled signals generated by the voltage controlled delay circuit 1, and the flip-flop circuit 165 is controlled by the set signal CASS and the reset signal CASR to generate the /CAS signal. Without being affected by the production process, therefore, the /CAS signal having an accurate pulse width can be generated.

Figure 17:
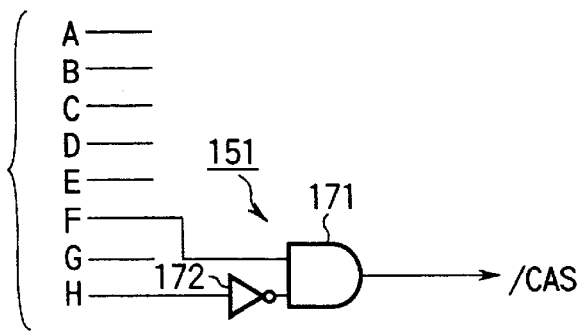
FIG. 17 is a circuit diagram showing a variant example of a rearrangement circuit shown in FIG. 15.

FIG. 17 shows a variant example of the rearrangement circuit. In the case of this example, the /CAS signal is generated by using the signals of the input terminals F and H of the delay cells 150f and 150h. In other words, the input terminal F is connected to one end of an AND circuit 171, and the input terminal H is connected to the other input end of the AND circuit 171 via an inverter circuit 172. This configuration is also capable of generating the /CAS signal having an accurate pulse width.

A third embodiment of the present invention will now be described. In this embodiment, the present invention is applied to, for example, a microcomputer. Recently in microcomputers, the frequency of the system clock signal is lowered in a waiting state such as a keyboard input waiting state to decrease the power dissipation. In microcomputers, therefore, a plurality of system clock signals having different frequencies are used according to the situation.

Figure 19:
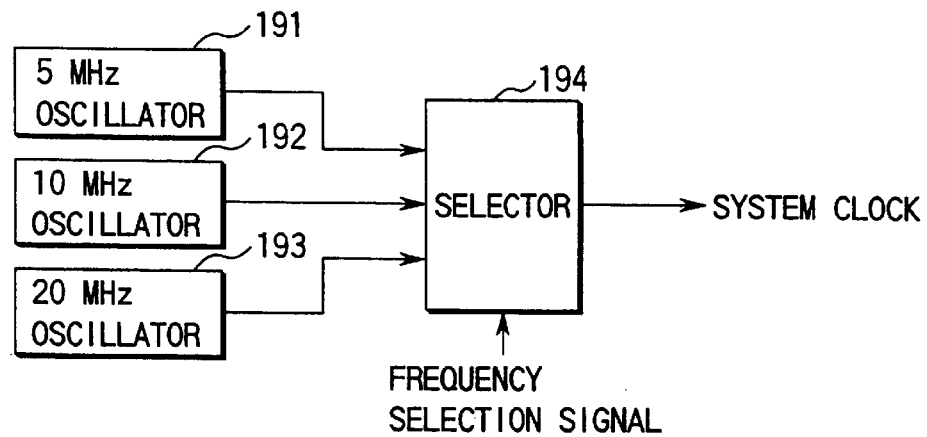
FIG. 19 is a circuit diagram showing a conventional circuit for generating a system clock signal.
Figure 20:
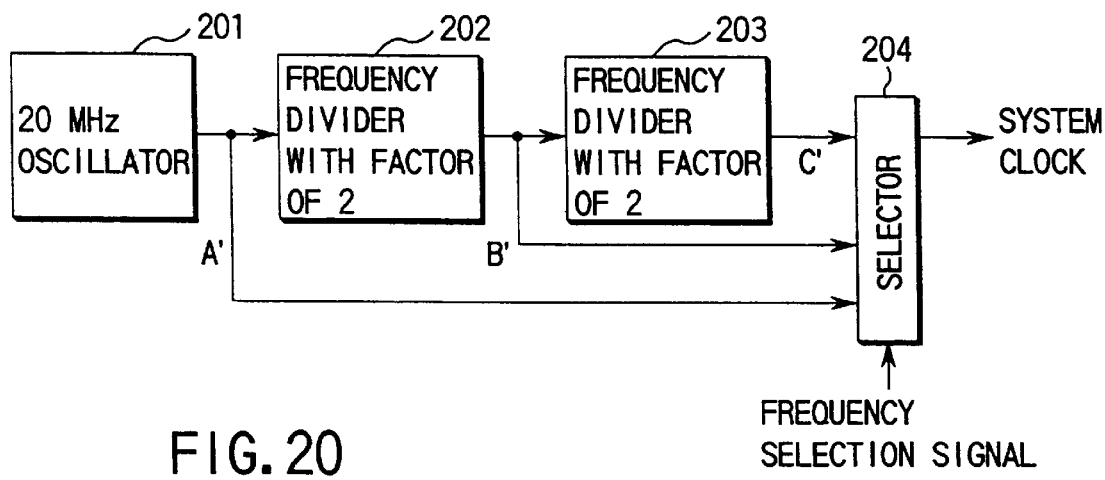
FIG. 20 is a circuit diagram showing a conventional circuit for generating a system clock signal.

FIGS. 19 and 20 show conventional circuits for generating system clock signals. The circuit shown in FIG. 19 has an oscillator 191 for generating a clock signal of, for example, 5 MHz, an oscillator 192 for generating a clock signal of, for example, 10 MHz, and an oscillator 193 for generating a clock signal of, for example, 20 MHz. According to a frequency selection signal, a selection out of output signals of the oscillators 191, 192 and 193 is conducted by a selector 194. In the case of this circuit, a plurality of oscillators are needed, and consequently the circuit scale is large. In addition, the oscillators are independent of each other and are not in synchronism with each other. When an oscillator is changed over, therefore, noise is generated on the clock signal. The circuit shown in FIG. 19 has such problems.

Figure 21:
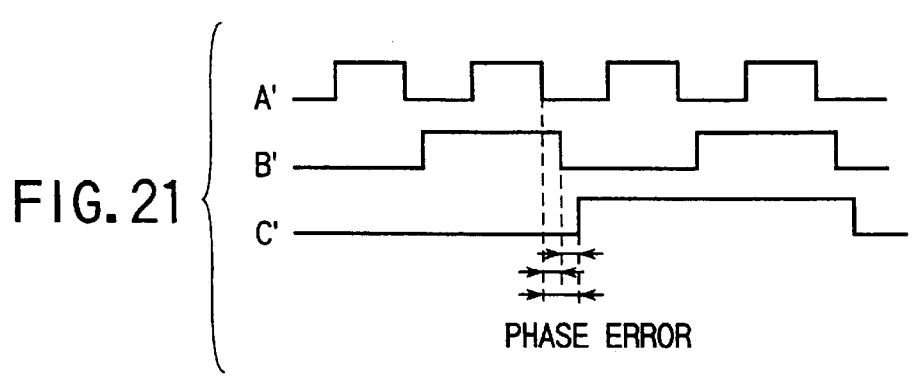
FIG. 21 is a timing diagram showing the operation of the circuit shown in FIG. 20.

In the circuit shown in FIG. 20, a clock signal of, for example, 20 MHz generated by an oscillator 201 is subjected to frequency division in frequency dividers 202 and 203 each with a frequency division factor of 2. A selection out of these signals is conducted by a selector 204, and the selected signal is output. By using this circuit, the problems of the circuit shown in FIG. 19 can be solved. In the case of this circuit, however, the frequency dividers 202 and 203 are connected in series. Therefore, the path length for generating the clock signal of 10 MHz is different from the path length for generating the clock signal of 5 MHz. As shown in FIG. 21, therefore, a phase error is caused between a signal at an input end of each frequency divider and a signal at an output end of the frequency divider. Thus, there is a possibility that false operation is caused when using these signals. In this embodiment, therefore, output signals of the voltage controlled delay circuit are used to make possible generation of a plurality of clock signals free from phase error.

Figures 22, 23:
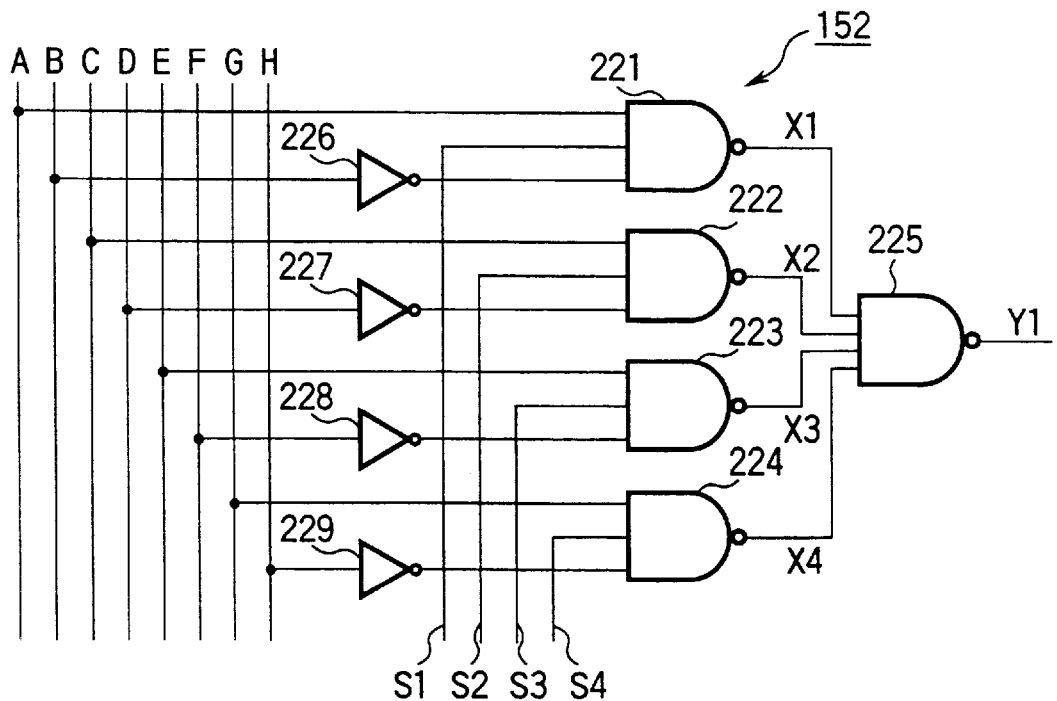
FIG. 22 is a circuit diagram showing a third embodiment of the present invention.
FIG. 23 is a diagram showing the operation of FIG. 22.

FIG. 22 shows a circuit of a third embodiment according to the present invention. FIG. 22 shows the rearrangement circuit 152 illustrated in FIG. 15. The same components as those of FIG. 15 are denoted by like characters. The rearrangement circuit 152 is formed of NAND circuits 221 to 225 and inverter circuits 226 to 229. Among the input terminals A to H of the delay cells forming the voltage controlled delay circuit 1, the input terminal A is connected to a first input terminal of the NAND circuit 221, and the input terminal B is connected to a second input terminal of the NAND circuit 221 via the inverter circuit 226. A third input terminal of the NAND circuit 221 is supplied with a signal S1 forming a frequency selection signal. Furthermore, the input terminal C is connected to a first input terminal of the NAND circuit 222, and the input terminal D is connected to a second input terminal of the NAND circuit 222 via the inverter circuit 227. A third input terminal of the NAND circuit 222 is supplied with a signal S2 forming the frequency selection signal. In addition, the input terminal E is connected to a first input terminal of the NAND circuit 223, and the input terminal F is connected to a second input terminal of the NAND circuit 223 via the inverter circuit 228. A third input terminal of the NAND circuit 223 is supplied with a signal S3 forming the frequency selection signal. In addition, the input terminal G is connected to a first input terminal of the NAND circuit 224, and the input terminal H is connected to a second input terminal of the NAND circuit 224 via the inverter circuit 229. A third input terminal of the NAND circuit 224 is supplied with a signal S4 forming the frequency selection signal. Output signals X1 to X4 of NAND circuits 221 to 224 are supplied to the NAND circuit 225. From an output terminal of the NAND circuit 225, a selected system clock signal Y1 is output.

Figure 24:
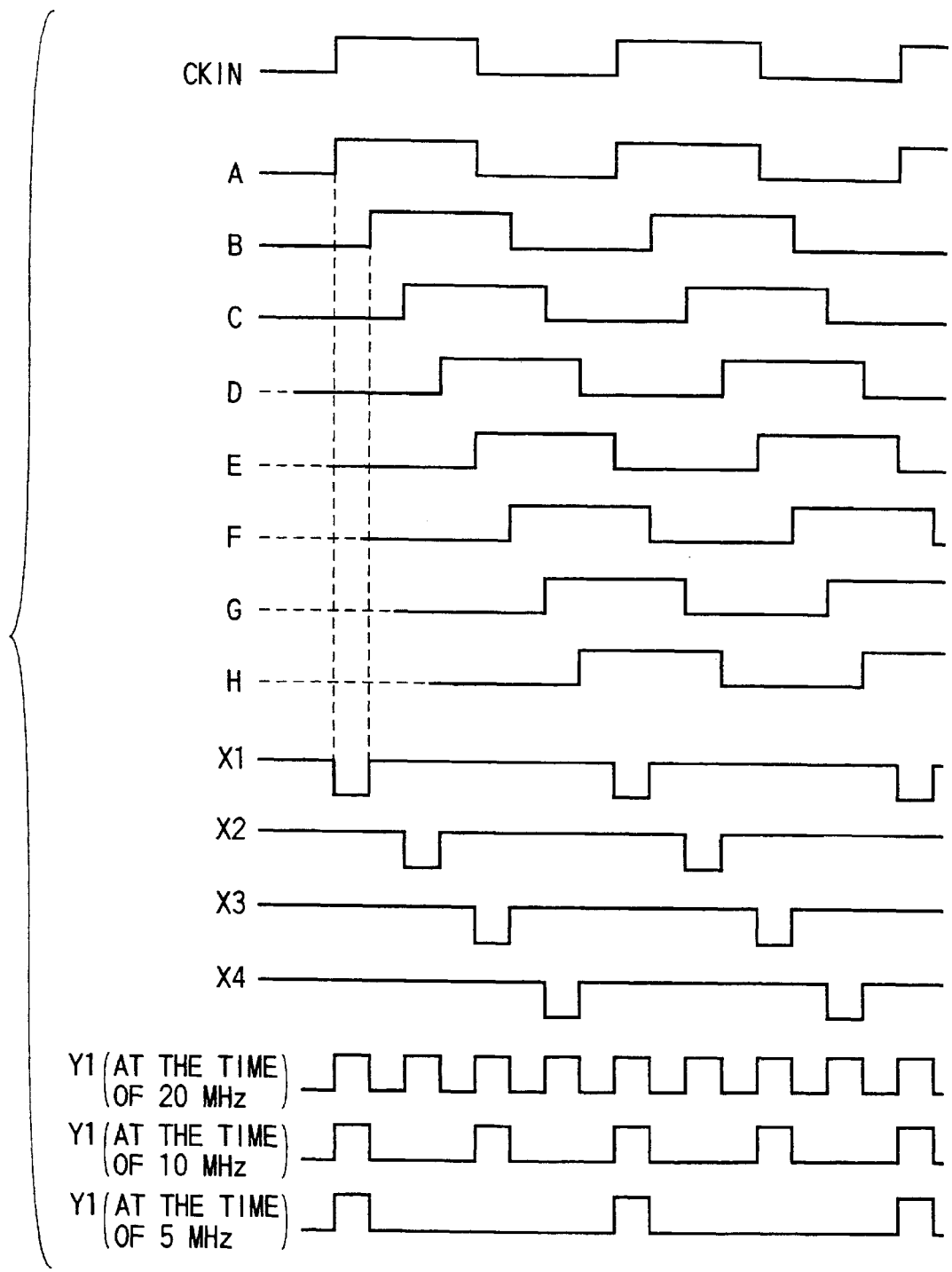
FIG. 24 is a timing diagram showing the operation of the circuit shown in FIG. 22.

FIG. 23 shows the relation between levels of the signals Si to S4 forming the frequency selection signal and a selected frequency. FIG. 24 shows the operation of the circuit of FIG. 22. Output signals of the NAND circuits 221 to 224 are output according to the signals S1 to S4. By using a combination of the signals S1 to S4, a required frequency can be selected.

In the third embodiment, signals of input terminals of delay cells forming the voltage controlled delay circuit 1 are thus supplied to the rearrangement circuit 152 formed of the NAND circuits 221 to 225 and the inverter circuits 226 to 229. The rearrangement circuit 152 generates each of signals of 20 MHz, 10 MHz and 5 MHz by using two NAND circuits and one inverter circuit. Since the path lengths in generating signals of respective frequencies are thus the same, it is possible to prevent the occurrence of a phase error and generate signals of respective frequencies. In addition, since the rearrangement circuit can be formed by a small scale circuit, it can contribute to reduction of the power dissipation.

Figure 25:
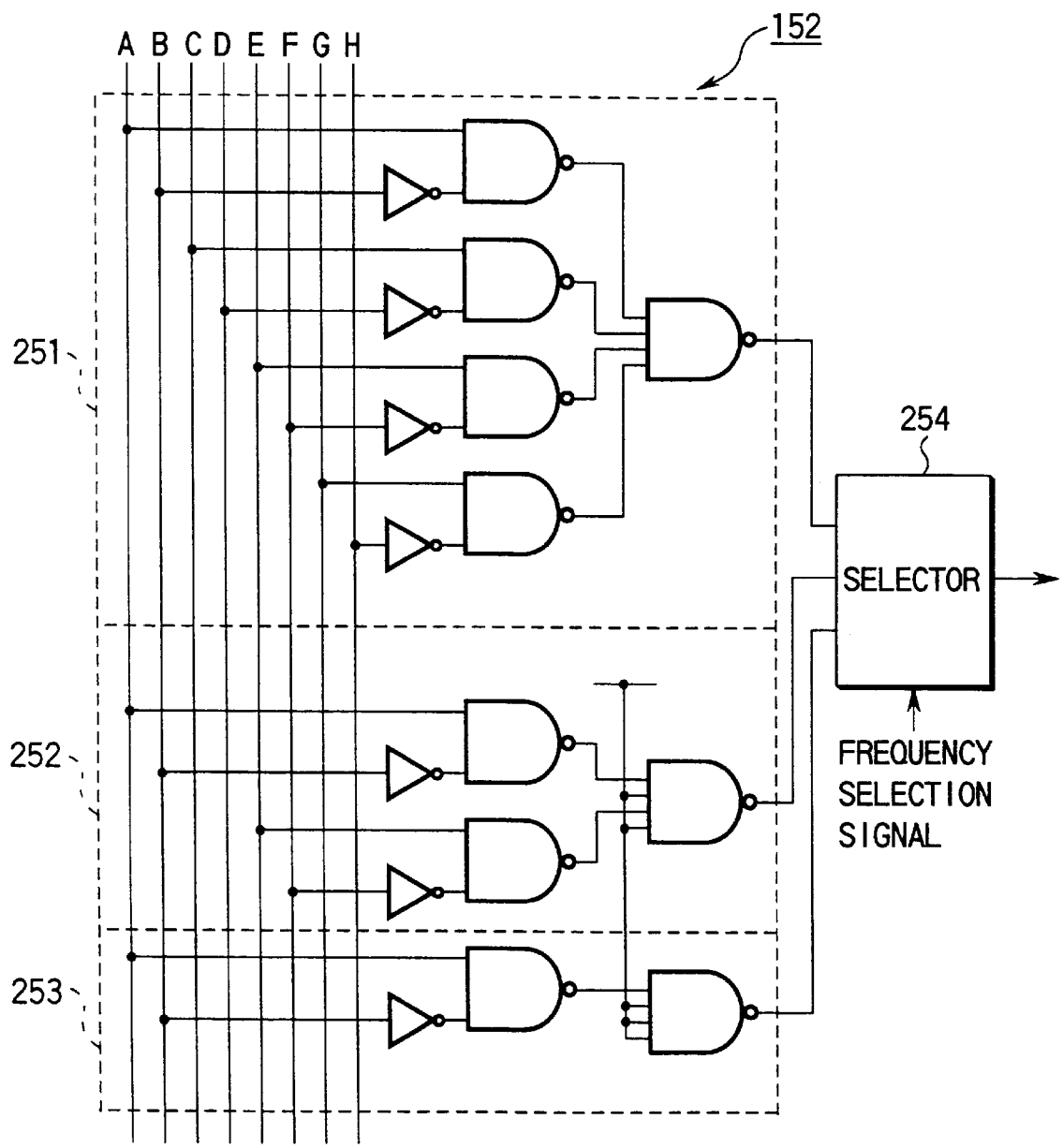
FIG. 25 is a circuit diagram showing a variant example of a third embodiment.

FIG. 25 shows a variant example of the rearrangement circuit 152. This circuit has a 20 MHz generation circuit 251, a 10 MHz generation circuit 252, and a 5 MHz generation circuit 253. The generation circuits 251, 252 and 253 are provided with the same number of stages of the logic circuits (inverter circuit and NAND circuits) for generating a signal and the same path length. These generation circuits 251, 252 and 253 always generate signals of respective frequencies according to the signals of the input terminals A to H of the delay cells forming the voltage controlled delay circuit 1. Output signals of the generation circuits 251, 252 and 253 are supplied to a selector 254. According to the frequency selection signal, the selector 254 selects one out of the output signals of the generation circuits 251, 252 and 253, and outputs the selected signal.

Also when such a configuration is used, effects similar to those of the rearrangement circuit shown in FIG. 22 can be obtained.

Figure 26:
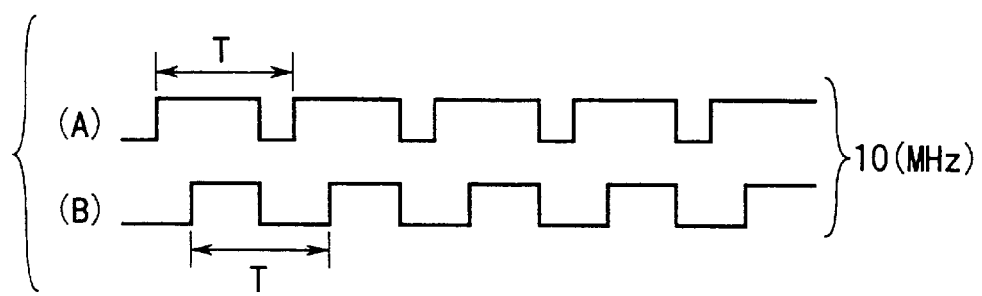
FIG. 26 is a waveform diagram showing examples of a third embodiment.

If a signal having a required frequency is to be generated by using the signals of the input terminals A to H of the delay cells and a signal having a frequency lower than the reference clock frequency, for example, having a frequency of 10 MHz is to be generated, the duty ratio can be varied to various values according to the setting of the logical circuit as shown in FIG. 26.

A fourth embodiment of the present invention will now be described. In the case where changeover is conducted among a plurality of system clock signals, for example, in the circuit shown in FIG. 25, the following problem occurs.

Figure 27:
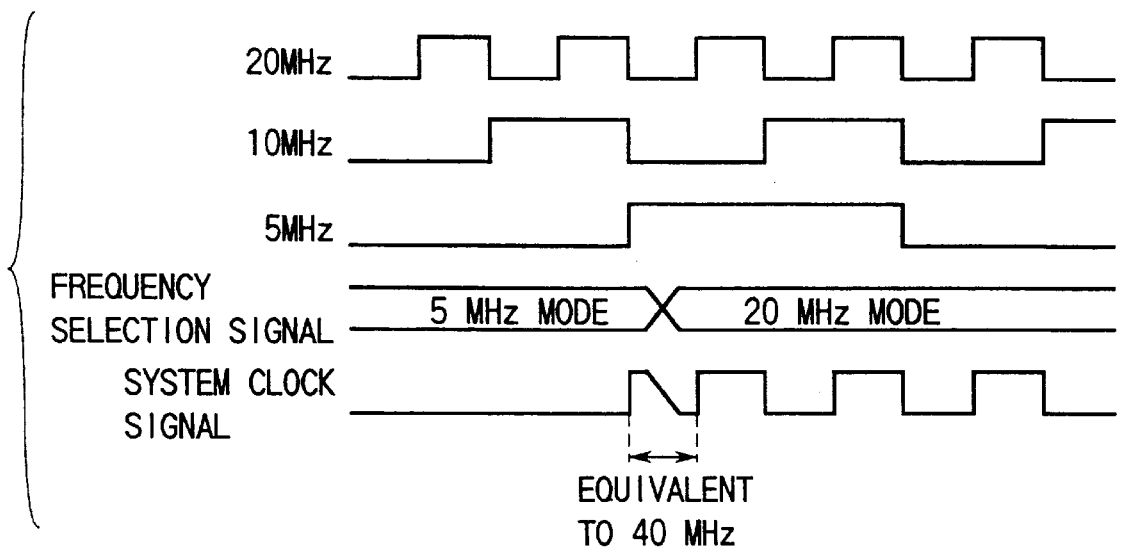
FIG. 27 is a timing diagram showing a conventional system clock signal.

It is now assumed that, for example, the 5 MHz mode using the system clock signal of 5 MHz is changed over to the 20 MHz mode using the system clock signal of 20 MHz according to the frequency selection signal as shown in FIG. 27. If in this case the system clock signal of 5 MHz is its high level and the system clock signal of 20 MHz is its low level, then a signal of 40 MHz is generated at the time of the changeover. If the signal of 40 MHz is thus supplied to a semiconductor integrated circuit having a highest frequency of the system clock signal equivalent to 20 MHz, false operation occurs.

In the fourth embodiment, timing of supply of the frequency selection signal to the selector is controlled on the basis of a predetermined signal output from the voltage controlled delay circuit. Thereby, a system clock signal having a frequency higher than the highest frequency used in that semiconductor integrated circuit is prevented from occurring at the time of changeover of the system clock signal.

Figure 28:
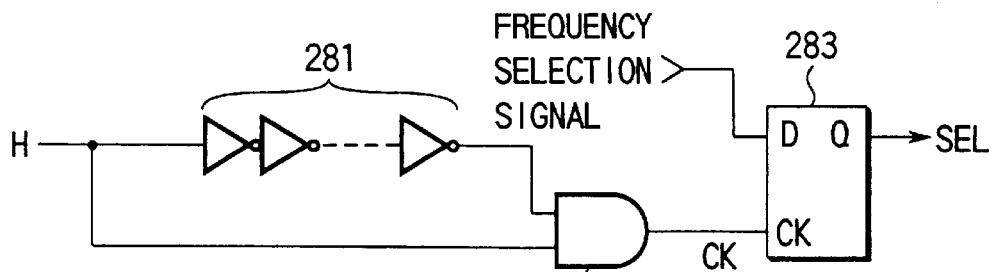
FIG. 28 is a circuit diagram showing a fourth embodiment of the present invention.

FIG. 28 shows a timing adjustment circuit according to this embodiment, and shows a circuit in the case where changeover between the 5 MHz mode and the 20 MHz mode is conducted. The signal of the input terminal H of the delay cell 150h forming the voltage controlled delay circuit 1 is supplied to one input end of an AND circuit 282 via a delay circuit 281, and it is supplied to the other input end of the AND circuit 282 as well. The delay circuit 281 is formed of an odd number of, for example, nine inverter circuits connected in series. An output terminal of the AND circuit 282 is supplied to a clock signal input terminal CK of a register 283 formed of a D-type flip-flop circuit. A signal input terminal D of the register 283 is supplied with the frequency selection signal. From a set output terminal Q of the register 283, a selection signal SEL adjusted in timing is output. This selection signal SEL is supplied to the selector 254 shown in FIG. 25. By this signal, a selection out of signals having different frequencies output from respective generation circuits is conducted. As for this circuit, the delay circuit, the AND circuit, and the register may be increased according to the number of selected frequencies.

Figure 29:
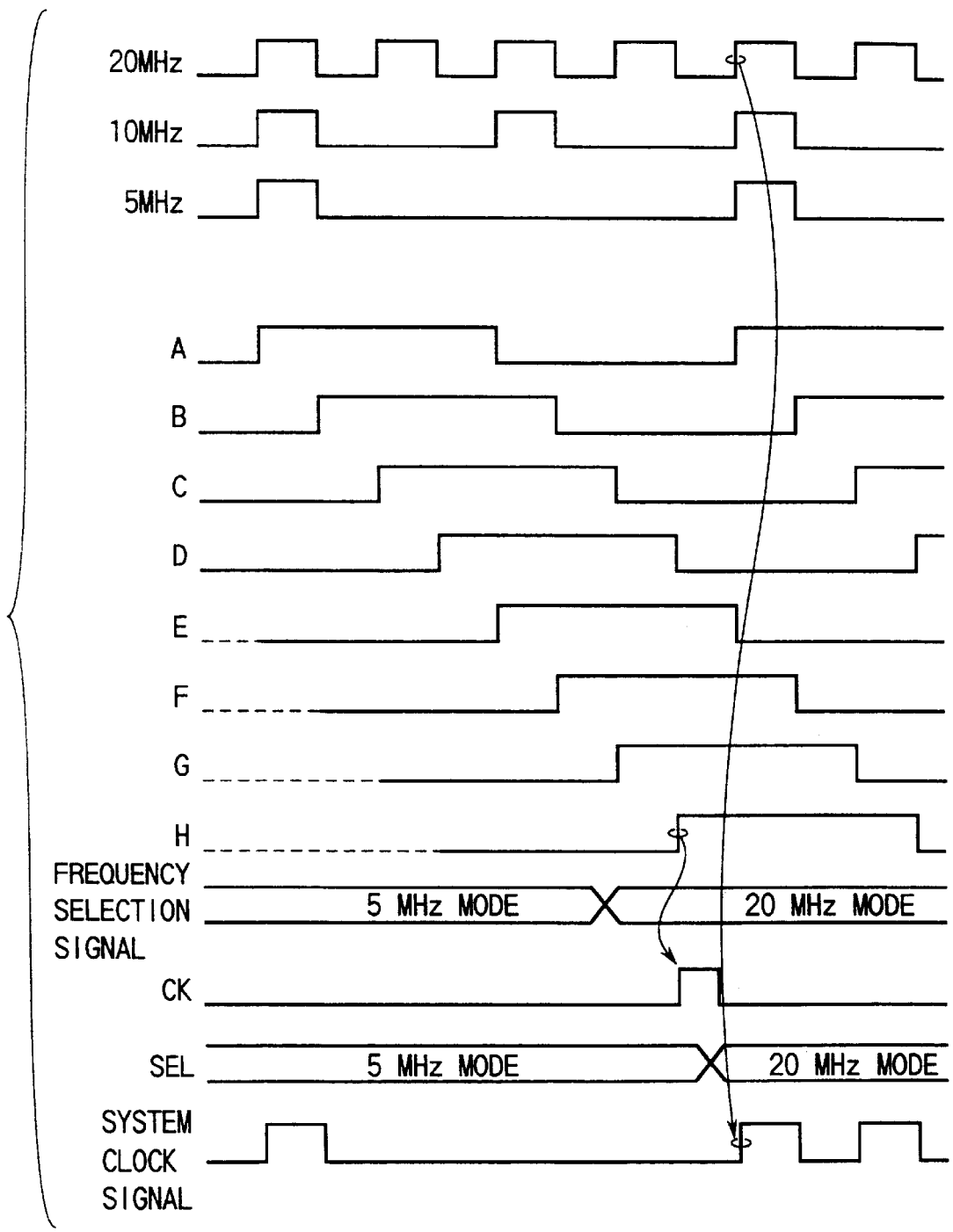
FIG. 29 is a timing diagram showing the operation of the circuit shown in FIG. 28.

FIG. 29 shows the operation of the circuit shown in FIG. 28. It is now assumed that the 5 MHz mode has been selected by the selection signal SEL output from the register 283. If in this state the frequency selection signal is changed over from the 5 MHz mode to the 20 MHz mode, the register 283 is not immediately changed over. If thereafter the signal of the input end H of the delay cell 150h becomes its high level, a signal CK is output from the output terminal of the AND circuit 282. Since the signal CK is supplied to the register 283, the selection signal SEL output from the register 283 is changed over from the 5 MHz mode to the 20 MHz mode. The signal of the input terminal H of the delay cell 150h is in synchronism with the signals output from respective generation circuits. If the selection signal SEL is changed over, therefore, the selector selectively outputs the system clock signal of 20 MHz output from the generation circuit, in response to this selection signal.

In the fourth embodiment, the output changeover timing of a plurality of generation circuits for generating system clock signals of respective frequencies is obtained in response to the signals of the delay cells forming the voltage controlled delay circuit 1. When changing over the frequency of each mode, therefore, changeover in the middle of a signal of a different mode can be prevented. Therefore, occurrence of a signal having a frequency higher than the highest frequency can be prevented. Thus false operation can be prevented.

A fifth embodiment will now be described. Here, the case where the present invention has been applied to a latch signal generation circuit for controlling the operation of a latch circuit provided in a microcomputer will now be described.

Figure 30:
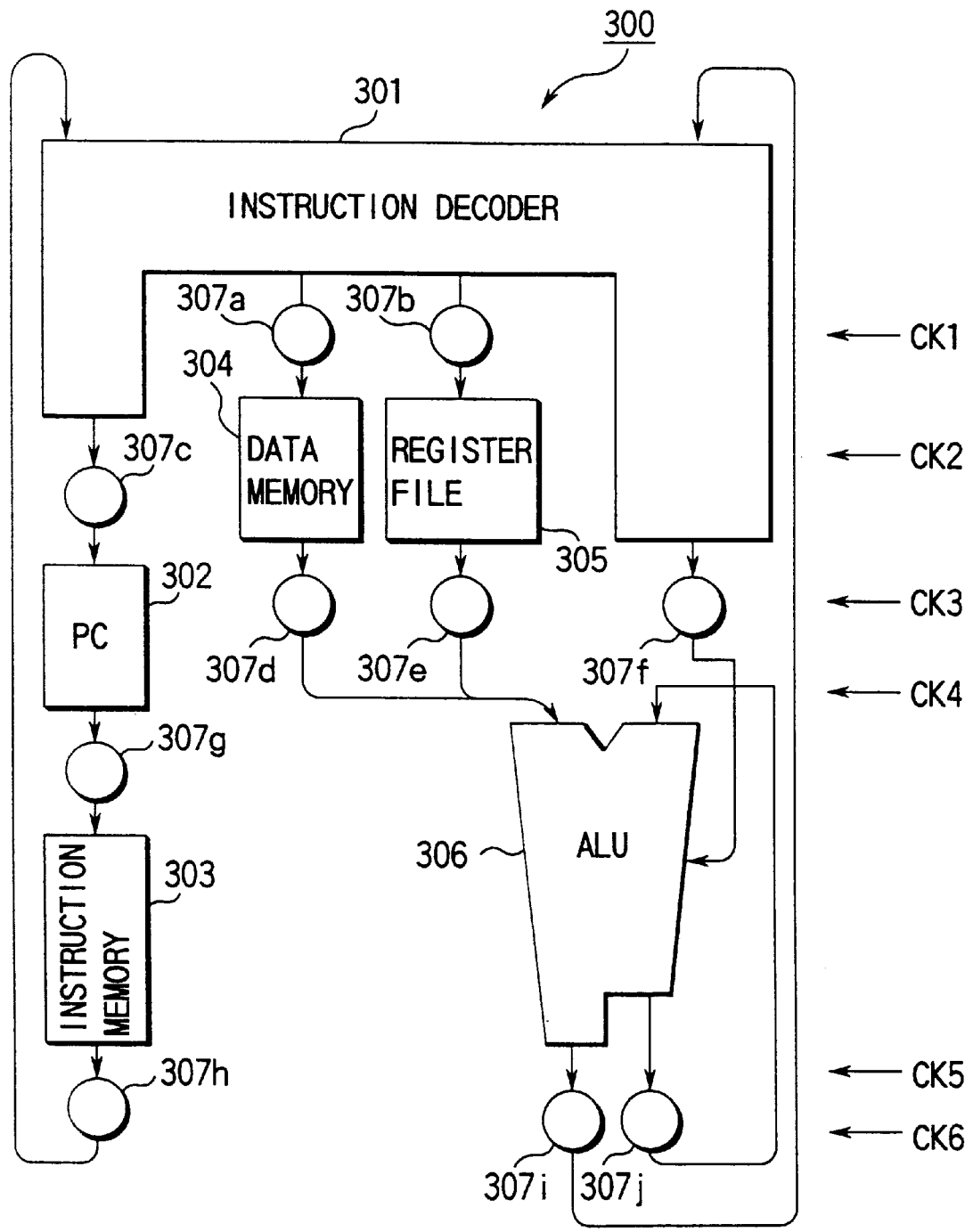
FIG. 30 is a diagram showing operation timing of a microcomputer.

FIG. 30 shows an example of a microcomputer. This microcomputer 300 includes, for example, an instruction decoder 301, a programmable counter 302, an instruction memory 303, a data register 304, a register file 305, an ALU (arithmetic logic unit) 306, and a plurality of latch circuits 307a, 307b, 307c, 307d, 307e, 307f, 307g, 307h, 307i and 307j for latching output signals of these circuits. Each of the instruction decoder 301, the programmable counter 302, the instruction memory 303, the data register 304, the register file 305 and the ALU (arithmetic logic unit) 306 is called, for example, macro block.

By the way, the latch timing of each of the latch circuits 307a to 307j needs to be set according to the operation speed of the corresponding macro block. As described before, however, it was difficult to set accurate delay time by using an inverter circuit. Therefore, it was difficult to set the latch signal supplied to each of the latch circuits 307a to 307j according to the operation speed of each macro block. As a result, each clock signal was made equal to the longest clock signal. It thus took a long time to latch a signal. Increasing the operation speed of the microcomputer was thus hindered. In the present embodiment, therefore, it is made possible to generate a clock signal of accurate timing by using the output signals of the voltage controlled delay circuit.

Figure 31:
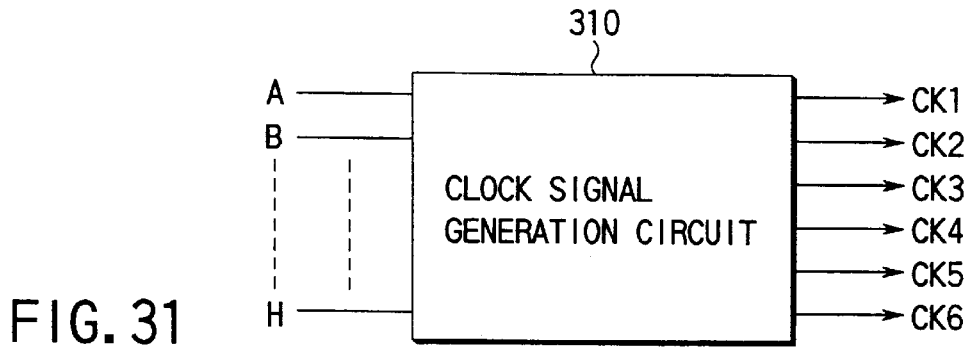
FIG. 31 is a circuit diagram showing a fifth embodiment of the present invention.

FIG. 31 shows a clock signal generator circuit 310 according to the present embodiment. This clock signal generator circuit 310 is supplied with the signals of the input terminals A to H of the delay cells 150a to 150h of the voltage controlled delay circuit 1. The clock signal generator circuit 310 is formed of a logic circuit including AND circuit and inverter circuits. According to the supplied signals, the clock signal generator circuit 310 generates clock signals CK1 to CK6. Output timing of each of the clock signals CK1 to CK6 is set according to the operation speed of the macro block connected to each latch circuit. The number of delay cell stages forming the voltage controlled delay circuit 1 is not limited to 8. By increasing the number of delay cell stages, the resolution of the clock signal can be further improved. Furthermore, the circuit configuration of the clock signal generator circuit 310 can be varied in various ways according to the microcomputer specifications.

Figure 32:
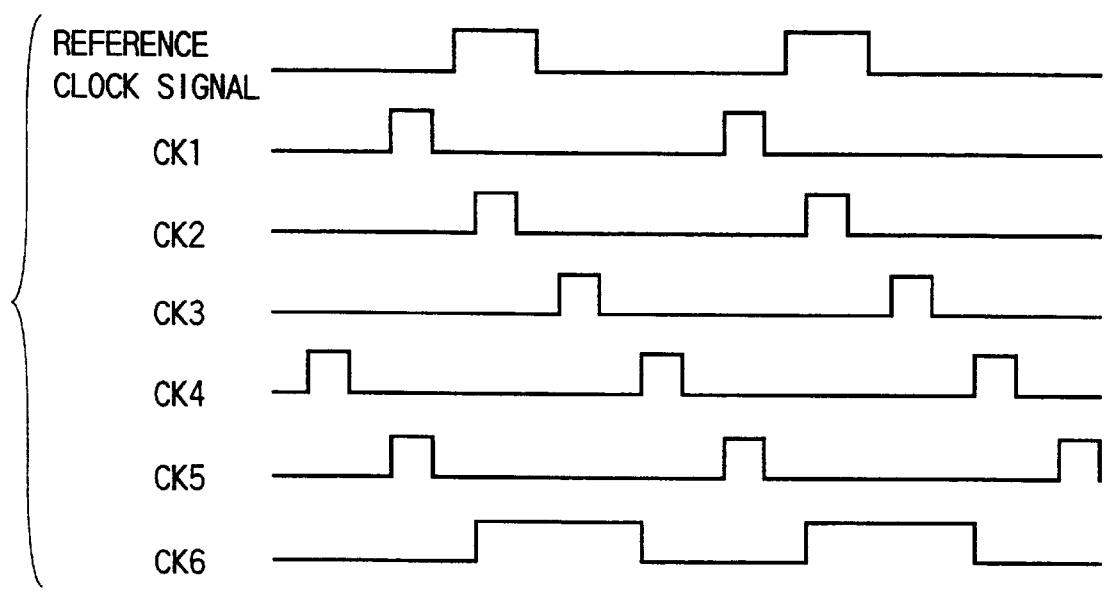
FIG. 32 is a timing diagram showing the operation of the circuit shown in FIG. 31.

FIG. 32 shows an example of the clock signals CK1 to CK6. As in this example, the clock signal CK1 supplied to the latch circuits 307a and 307b connected to the instruction decoder 301 operating at high speed has a smaller duty ratio as compared with the clock signal supplied to the latch circuits 307i and 307j connected to the ALU 306 operating at a comparatively low speed. These clock signals CK1 to CK6 are supplied to respective latch circuits shown in FIG. 30.

Thus in this embodiment, the clock signal generator circuit 310 generates the clock signals according to the output signals of the delay cells forming the voltage controlled delay circuit 1. Therefore, the clock signals each having timing suitable for the operation speed of each macro block can be generated. As a result, the speed of the microcomputer can be increased.

A sixth embodiment of the present invention will now be described. Here, the case where the present invention has been applied to a circuit for measuring the operation speeds of the macro blocks will now be described. Heretofore, the operation speed of each of the macro blocks forming a microcomputer has been measured by connecting an external tester to the microcomputer and using signals supplied from the tester. However, this tester is large sized and expensive, resulting in increased production costs of semiconductor integrated circuits. In this embodiment, therefore, the operation speed measurement of the macro blocks is facilitated.

Figure 33:
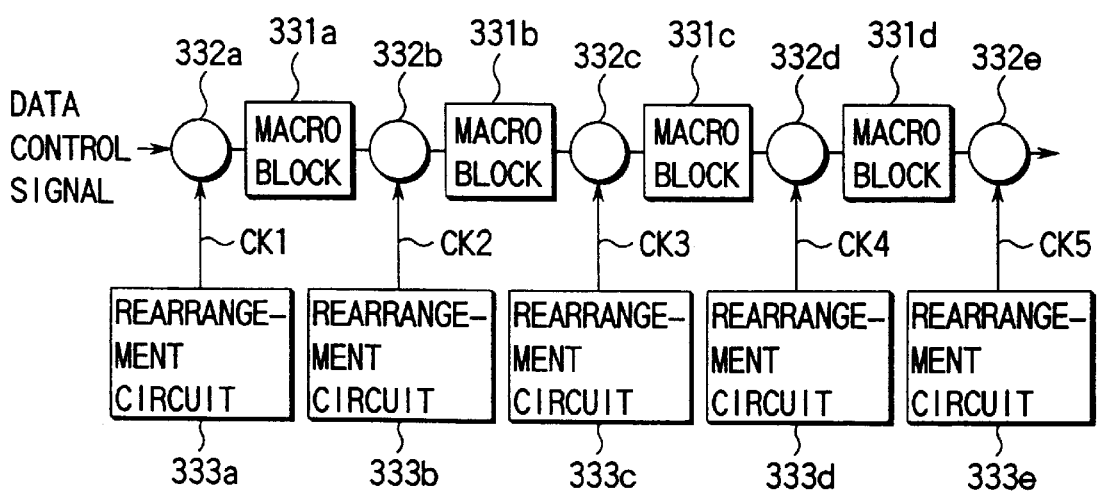
FIG. 33 is a circuit diagram showing a sixth embodiment of the present invention.

FIG. 33 shows a measurement circuit 330 according to this embodiment. In this measurement circuit, each of a plurality of macro blocks 331a, 331b, 331c and 331d is connected between a plurality of latch circuits 332a, 333b, 332c, 332d and 332e for latching data and control signals. These macro blocks correspond to the above described instruction decoder, program counter, instruction memory, ALU and so on. To the latch circuits 332a, 332b, 332c, 332d and 332e, rearrangement circuits 333a, 333b, 333c, 333d and 333e are connected, respectively. The rearrangement circuits 333a to 333e generate clock signals according to the signals of the input terminals of the delay cells forming the voltage controlled delay circuit 1, and supply the clock signals to the corresponding latch circuits 332a to 332e. In this example, the voltage controlled delay circuit 1 is formed of delay cells of 20 stages connected in series in order to improve the resolution. Each of the rearrangement circuits 333a to 333e is supplied with one to four or five signals from the voltage controlled delay circuit 1.

FIG. 35 shows an example of the rearrangement circuit 332e. First input terminals of AND circuits 341a, 341b, 341c and 341d are supplied with signals 16, 17, 18 and 19 of the input terminals of the delay cells forming the voltage controlled delay circuit 1, respectively. Second input terminals of the AND circuits 341a, 341b, 341c and 341d are supplied with signals 17, 18, 19 and 20 of the input terminals of the delay cells, respectively. Third input terminals of the AND circuits 341a, 341b, 341c and 341d are supplied with test control signals CS17, CS18, CS19 and CS20, respectively. Output terminals of the AND circuits 341a, 341b, 341c and 341d are connected to input terminals of an OR circuit 343. From an output terminal of the OR circuit 343, the above described clock signal CK5 is output.

Other rearrangement circuits also have the same configuration as that of the rearrangement circuit 333e. These rearrangement circuits are supplied with corresponding output signals of the voltage controlled delay circuit 1 and control signals.

FIG. 36 shows schematic operation of the circuit of FIG. 33. Typically, the rearrangement circuits 333a to 333e generate the clock signals CK1 to CK5 according to the output signals of the voltage controlled delay circuit 1. These clock signals CK1 to CK5 are supplied to the latch circuits 332a to 332e, respectively. The latch circuits 332a to 332e latch data or control signals according to the clock signals CK1 to CK5, respectively.

On the other hand, in the case where the operation speed of, for example, the macro block 331d is measured, occurrence timing of the clock signal CK5 output from the rearrangement circuit 333e is gradually quickened. In other words, a timing interval between the clock signals CK4 and CK5 is gradually shortened. If the occurrence timing of the clock signal CK5 is thus gradually quickened, then it becomes impossible to latch the output signal of the macro block 331d by using the latch circuit 332e, and operation of a circuit which follows the latch circuit 332e and which is not illustrated becomes impossible. The time interval between the clock signals CK4 and CK5 at this time becomes the operation speed of the macro block 331d.

To be concrete, the control signals CS20 to CS17 shown in FIG. 35 are successively supplied to AND circuits 341a to 341d, respectively. The 16th to 20th signals of the voltage controlled delay circuit 1 shown in FIG. 34 are successively delayed from the reference clock signal as shown in FIG. 37. The rearrangement circuit 333e is normally supplied with the control signal CS20. According to the control signal CS20, the rearrangement circuit 333e outputs the clock signal CK5 corresponding to the 19th and 20th signals of the voltage controlled delay circuit 1 as shown in FIG. 37.

On the other hand, at the time of measurement, the AND circuits 341a to 341d are successively supplied with the control signals CS20 to CS17. According to the control signals CS20 to CS17, the occurrence timing of the clock signal CK5 is quickened corresponding to the 20th to 16th signals of the voltage controlled delay circuit 1. In other words, signals are successively output from the AND circuits 341d to 341a in response to the control signals CS20 to CS17, and the signals are output from the OR circuit 343 as the clock signal CK5. The latch circuit 332e is controlled by the clock signal CK5. When it becomes impossible to latch the output signal of the macro block 331d by using the latch circuit 332e and the operation of the circuit which follows the latch circuit 332e and which is not illustrated has become impossible, the operation speed of the macro block 331d can be measured from the time interval between the clock signals CK4 and CK5.

In the sixth embodiment, the operation speed of the macro block is made measurable by changing the occurrence timing of the clock signal which controls the latch circuit by using the output signals of the voltage controlled delay circuit 1. By using a simple configuration, therefore, the operation speed of the macro block can be measured.

The present invention is not limited to the above described embodiments. It is a matter of course that the present invention can be implemented without departing from the spirit of the invention.

According to the present invention, frequency multiplied clock signals corresponding to a change of the frequency multiplication factor and a change of the frequency of the external clock signal are generated by the selected waveform generation circuit and the phase comparison input selection circuit each formed of a digital logic circuit as heretofore described. Therefore, the change of the delay value of the voltage controlled delay circuit can be made small, and it becomes possible to prevent jitter and a phase error of the frequency multiplied clock signal.

Furthermore, by using the output signals of the voltage controlled delay circuit, the /CAS signal having an accurate pulse width can be generated without being influenced by the production process.

In addition, it is possible to generate signals of respective frequencies while preventing the occurrence of a phase error by using a small scale circuit.

Furthermore, since the latch signals of timing corresponding to the operation speed of each macro block can be generated, contribution to higher speed of microcomputers becomes possible.

Furthermore, the operation speed of macro blocks can be measured by using a simple configuration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency multiplier circuit comprising:
   a voltage controlled delay circuit controlled by a control voltage, including delay cells of plural stages connected in series, an input terminal of a delay cell of a first stage being supplied with a reference clock signal;
   a selection circuit supplied with at least two output signals of said delay cells of plural stages at an input thereof, said selection circuit conducting a selection out of said signals received from said delay cells and outputting the selected signal, according to a first setting signal for setting a frequency multiplication factor and a second setting signal for setting a frequency range of said reference clock signal;
   a phase comparator supplied with the output signal of said selection circuit at a first input terminal and supplied with said reference clock signal at a second input terminal;
   a low-pass filter having an input terminal connected to an output terminal of said phase comparator, and an output terminal connected to an input terminal of a control voltage of said voltage controlled delay circuit; and
   a waveform generation circuit supplied at an input thereof with at least two output signals, which are the same or different from said at least two output signals of said delay cells of plural stages, said waveform generation circuit generating and outputting a frequency multiplied clock signal from signals input from said delay cells according to said first setting signal and said second setting signal.

2. A frequency multiplier circuit according to claim 1, wherein said delay cells have delay values changed according to said control voltage, and said delay cells operate in such a range of a delay characteristic that a change of the delay value caused by noise of said control voltage is small.

3. A frequency multiplier circuit according to claim 1, wherein said selection circuit and said waveform generation circuit comprise digital logic circuits.

4. A frequency multiplier circuit according to claim 1, wherein said frequency multiplied clock signal has a fixed pulse width shorter than a period of said reference clock signal for controlling an operation of a semiconductor memory.

5. A frequency multiplier circuit according to claim 4, wherein said delay cells have delay values changed according to said control voltage, and said delay cells operate in such a range of a delay characteristic that a change of the delay value caused by noise of said control voltage is small.

6. A frequency multiplier circuit according to claim 4, wherein said generation circuit comprises digital logic circuits.

7. A frequency multiplier circuit comprising:
   a voltage controlled delay circuit controlled by a control voltage, including delay cells of plural stages connected in series, an input terminal of a delay cell of a first stage being supplied with a reference clock signal;
   a phase comparator supplied with an output signal of a delay cell of a final stage at a first input terminal and supplied with said reference clock signal at a second input terminal;
   a low-pass filter having an input terminal connected to an output terminal of said phase comparator, and an output terminal connected to an input terminal of a control voltage of said voltage controlled delay circuit;
   a plurality of generation circuits each supplied with a plurality of output signals of said delay cells of plural stages at an input thereof, said generation circuits generating signals of different frequencies to each other, respectively;
   a selection circuit for conducting a selection out of output signals of said plurality of generation circuits according to a frequency selection signal; and
   a control circuit for controlling an output timing of said frequency selection signal according to one of the output signals of said delay cells of plural stages.

8. A frequency multiplier circuit according to claim 7, wherein said delay cells have delay values changed according to said control voltage, and said delay cells operate in such a range of a delay characteristic that a change of the delay value caused by noise of said control voltage is small.

9. A frequency multiplier circuit according to claim 7, wherein said generation circuits comprise digital logic circuits.

10. A frequency multiplier circuit according to claim 1, wherein said frequency multiplied clock signal is generated and outputted at a timing corresponding to operations of respective macro blocks forming a microcomputer.

11. A frequency multiplier circuit according to claim 10, wherein said delay cells have delay values changed according to said control voltage, and said delay cells operate in such a range of a delay characteristic that a change of the delay value caused by noise of said control voltage is small.

12. A frequency multiplier circuit according to claim 10, wherein said generation circuit comprises digital logic circuits.

13. A frequency multiplier circuit comprising:
   a voltage controlled delay circuit controlled by a control voltage, including delay cells of plural stages connected in series, an input terminal of a delay cell of a first stage being supplied with a reference clock signal;
   a phase comparator supplied with an output signal of a delay cell of a final stage at a first input terminal and supplied with said reference clock signal at a second input terminal;
   a low-pass filter having an input terminal connected to an output terminal of said phase comparator, and an output terminal connected to an input terminal of control voltage of said voltage controlled delay circuit; and
   a plurality of generation circuits for generating clock signals provided so as to respectively correspond to latch circuits for latching output signals of a plurality of macro blocks forming a microcomputer, said clock signals controlling operations of said latch circuits,
   wherein when measuring operation speed of said macro blocks, said generation circuit supplies clock signals of different timing to latch circuits for latching the output signals of macro blocks to be measured, according to a plurality of output signals of said delay cells of plural stages.

14. A frequency multiplier circuit according to claim 13, wherein said delay cells have delay values changed according to said control voltage, and said delay cells operate in such a range of a delay characteristic that a change of the delay value caused by noise of said control voltage is small.

15. A frequency multiplier circuit according to claim 13, wherein said generation circuits comprise digital logic circuits.

* * * * *